(12) United States Patent
Moon et al.

(10) Patent No.: US 9,252,141 B2
(45) Date of Patent: Feb. 2, 2016

(54) SEMICONDUCTOR INTEGRATED CIRCUIT, METHOD FOR FABRICATING THE SAME, AND SEMICONDUCTOR PACKAGE

(71) Applicant: SAMSUNG ELECTRONICS CO., LTD., Suwon-si, Gyeonggi-do (KR)

(72) Inventors: Kwang-Jin Moon, Hwaseong-si (KR); Byung-Lyul Park, Seoul (KR); Jae-Hwa Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/326,282

(22) Filed: Jul. 8, 2014

(65) Prior Publication Data

US 2015/0129978 A1    May 14, 2015

(30) Foreign Application Priority Data

Nov. 14, 2013 (KR) .................. 10-2013-0138452

(51) Int. Cl.
*H01L 27/02* (2006.01)
*H01L 23/48* (2006.01)
*H01L 27/088* (2006.01)

(52) U.S. Cl.
CPC .......... *H01L 27/0296* (2013.01); *H01L 23/481* (2013.01); *H01L 27/088* (2013.01); *H01L 2224/16225* (2013.01); *H01L 2924/15311* (2013.01)

(58) Field of Classification Search
CPC .. H01L 27/0296; H01L 23/481; H01L 27/088
See application file for complete search history.

(56) References Cited

U.S. PATENT DOCUMENTS

| | | | |
|---|---|---|---|
| 5,994,742 A | 11/1999 | Krishnan et al. | |
| 6,417,544 B1 | 7/2002 | Jun et al. | |
| 7,282,444 B2 | 10/2007 | Tanida et al. | |
| 7,365,440 B2 | 4/2008 | Dotta | |
| 7,777,345 B2 | 8/2010 | Lee et al. | |
| 7,969,013 B2 | 6/2011 | Chen et al. | |
| 8,264,065 B2 | 9/2012 | Su et al. | |
| 2010/0096699 A1 | 4/2010 | Miyata | |
| 2010/0237386 A1* | 9/2010 | Lin ...................... | H01L 23/481 257/173 |
| 2011/0080185 A1 | 4/2011 | Wu et al. | |
| 2012/0061827 A1* | 3/2012 | Fujita ................ | H01L 21/30655 257/737 |
| 2012/0104499 A1 | 5/2012 | Kim | |
| 2012/0129341 A1 | 5/2012 | Jo et al. | |
| 2012/0168870 A1 | 7/2012 | Kim | |
| 2012/0193746 A1* | 8/2012 | Seo .............................. 257/476 | |
| 2013/0140709 A1 | 6/2013 | Matsuura | |

* cited by examiner

*Primary Examiner* — Yasser A Abdelaziez
*Assistant Examiner* — Farun Lu
(74) *Attorney, Agent, or Firm* — Volentine & Whitt, PLLC

(57) ABSTRACT

A semiconductor integrated circuit device includes a TSV (Through Silicon Via) extending through a substrate, a first well in the substrate adjacent a first surface of the substrate, a gate of an active device on the first well, a charging protection well, and a charging protection gate on the charging protection well. The charging protection well is disposed in the substrate adjacent the first surface of the substrate, is interposed between the TSV hole and the first well, and surrounds the TSV hole. The charging protection gate prevents the gate of the active device from being damaged when the TSV is formed especially when using a plasma etch process to form a TSV hole in the substrate.

18 Claims, 30 Drawing Sheets

100

104

SEMICONDUCTOR INTEGRATED CIRCUIT, METHOD FOR FABRICATING THE SAME, AND SEMICONDUCTOR PACKAGE

PRIORITY STATEMENT

This application is based on and claims priority from Korean Patent Application No. 10-2013-0138452, filed on Nov. 14, 2013 in the Korean Intellectual Property Office, the disclosure of which is hereby incorporated by reference in its entirety.

BACKGROUND

1. Field

The inventive concept relates to a semiconductor integrated circuit device, a method of fabricating the same, and a semiconductor package including the same.

2. Description of the Related Art

TSV (Through-Silicon-Via) technology has been recognized as very important to the development of three-dimensional (3D) packages in which semiconductor integrated circuit devices are stacked. In this respect, TSV technology includes forming TSVs (through-silicon-vias) vertically through a substrate or a die of each integrated circuit device to provide for an electrical connection in the 3D package. Thus, the performance and reliability of a 3D package hinges on the ability to form stable TSVs without degrading the performance of other components of the package, especially as 3D packages are scaled down.

SUMMARY

According to one aspect of the inventive concept, there is provided a semiconductor integrated circuit device that includes a substrate having a first outer surface and a second outer surface, a TSV (through silicon via) hole extending through substrate between the first surface and the second surface, a TSV contact in the TSV hole, a first well disposed in the substrate and having a surface contiguous with the first outer surface of the substrate, a first gate of an active device on the first well, a charging protection well disposed in the substrate and which is interposed between the TSV hole and the first well, has a surface contiguous with the first surface of the substrate at the outside of the substrate, and surrounds the TSV hole, and a charging protection gate on the charging protection well.

According to another aspect of the inventive concept, there is provided a semiconductor integrated circuit device that includes a substrate that has a first surface and a second surface, a TSV (through silicon via) extending through substrate between the first surface and the second surface, a first well in the substrate at the first surface and which has a P-type or N-type conductivity, a transistor including a gate electrode and a gate dielectric layer extending between the first well and the gate electrode, a charging protection well in the substrate and interposed between the TSV and the first well as spaced in the substrate from the first well, the charging protection well having the same type of conductivity as the first well, and a charging protection structure, wherein the charging protection structure comprises a protection dielectric layer on the charging protection well.

According to still another aspect of the inventive concept there is provided a semiconductor package including a package substrate, a first semiconductor integrated circuit device disposed on the package substrate, and a second semiconductor integrated circuit device disposed on the first semiconductor integrated circuit device, and in which the first semiconductor device includes: a device substrate that has a first outer surface and a second outer surface, a TSV (through silicon via) hole extending through the device substrate between the first surface and the second surface, a TSV contact in the TSV hole, a first well disposed in the device substrate and having a surface contiguous with the first outer surface of the device substrate, a first gate of an active device on the first well, a charging protection well disposed in the device substrate, interposed between the TSV hole and the first well, having a surface contiguous with the first outer surface of the device substrate, and surrounding the TSV hole, and a charging protection gate on the charging protection well.

BRIEF DESCRIPTION OF THE DRAWINGS

The above and other objects, features and advantages of the inventive concept will be more apparent from the following detailed description of preferred embodiments thereof taken in conjunction with the accompanying drawings, in which:

FIGS. 17 to 25 illustrate an embodiment of a method of fabricating a semiconductor integrated circuit device according to the inventive concept, wherein FIGS. 17 and 19 are plan views of the device during the course of its manufacture, FIG. 18 is a cross-sectional view taken along line A-A of FIG. 17, FIG. 20 is a cross-sectional view taken along line A-A of FIG. 19 and FIGS. 21, 22, 23, 24 and 25 are also cross-sectional views.

FIGS. 29 to 34 illustrate still another embodiment of a method of fabricating a semiconductor integrated circuit device according to the inventive concept, wherein FIGS. 29 and 31 are plan views of the device during the course of its manufacture, FIG. 30 is a cross-sectional view taken along line A-A of FIG. 29, FIG. 32 is a cross-sectional view taken along line A-A of FIG. 31 and FIGS. 33 and 34 are also cross-sectional views.

DETAILED DESCRIPTION OF THE PREFERRED EMBODIMENTS

Figure 1:
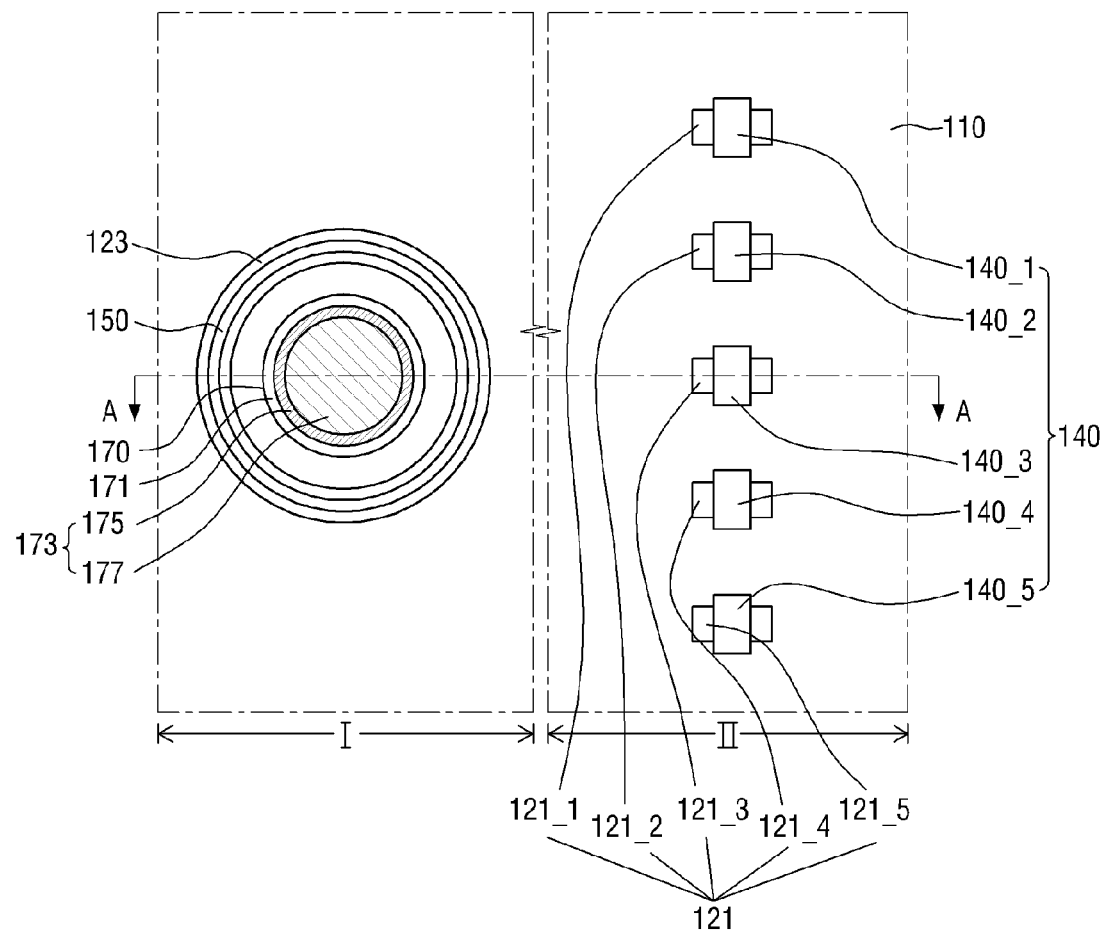
FIG. 1 is a plan view of an embodiment of a semiconductor integrated circuit device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions (e.g., wells and source/drain regions), shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, elements or features may be referred to herein in the singular for convenience only, and as the context and drawings indicate the embodiments may nonetheless include a plurality of such elements or features. Other terminology used herein for the purpose of describing particular examples or embodiments of the inventive concept is also to be taken in context. For example, the terms "comprises" or "comprising" when used in this specification specifies the presence of stated features or processes but does not preclude the presence or additional features or processes.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

It will be understood that although the terms first, second, etc. may be used herein to describe various elements, regions, layers, etc., but that these elements, regions, and/or layers are not limited by these terms. These terms are only used to distinguish one element, layer or region from another.

Furthermore, spatially relative terms may refer to the orientations shown in the drawings for ease of description and are not necessarily limiting as embodiments according to the inventive concept can assume orientations different than those illustrated in the drawings when in use.

Figure 2:
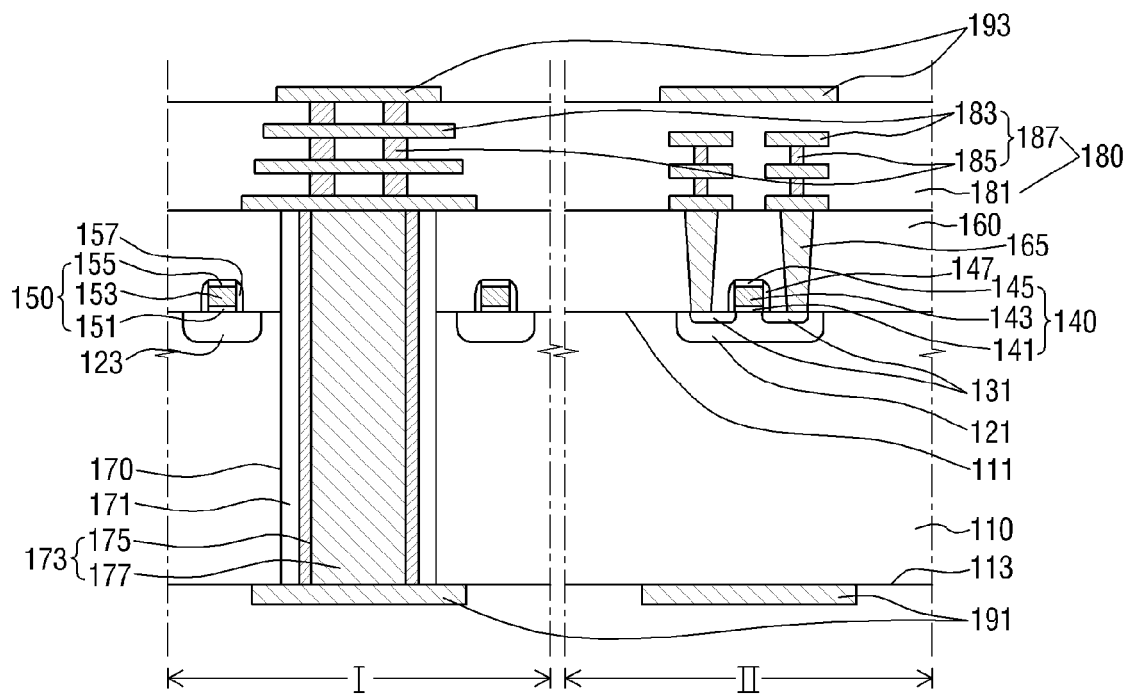
FIG. 2 is a cross-sectional view taken along line A-A of FIG. 1.

Referring now to FIGS. 1 and 2, an embodiment of a semiconductor integrated circuit device 100 according to the inventive concept will be described in detail.

The semiconductor integrated circuit device 100 may include a substrate 110, a well 121, a gate 140, a charging protection well 123, a charging protection gate 150, a TSV hole 170, a BEOL (Back-End-Of-Line) structure 180, and connection pads 191 and 193. For ease of understanding, FIG. 1 does not show the BEOL structure 180.

The semiconductor integrated circuit device 100 may be, for example, a flip chip, but is not limited thereto.

The substrate 110 may include a first region I and a second region II. The first region I may be a region where the TSV hole 170 is formed, and the second region II may be a region where a semiconductor device, for example, a transistor, is formed.

The substrate 110 may be formed of a semiconductor material or an insulating material. For example, the substrate 110 may be a silicon, germanium, silicon-germanium, gallium-arsenide (GaAs), glass, or ceramic bulk substrate or layer.

The TSV hole 170 penetrates the substrate 110. Specifically, the substrate 110 includes a first surface 111 and a second surface 113 that is opposite to the first surface 111, and the TSV hole 170 extends to and between the first surface 111 and the second surface 113. FIG. 1 illustrates a circular TSV hole 170, but the shape of the TSV hole 170 is not limited to being circular. That is, the TSV hole 170 may have various cross-sectional shapes.

A separation layer 171 and a TSV contact 173 are disposed in the TSV hole 170. The separation layer 171 extends along the surface defining the side of the TSV hole 170. The separation layer 171 may prevent interference between the TSV contact 173 and the substrate 110. The separation layer 171 may be, for example, an oxide layer, and may be formed using a CVD process.

The TSV contact 173 is disposed within the separation layer 171. The TSV contact 173 may include a seed layer 175 and a conductive layer 177. The seed layer 175 is formed on a side wall of the separation layer 171, and may serve as a seed of the conductive layer 177. The conductive layer 177 may fill the remaining portion of the TSV hole 170 and may be formed using the seed layer 175 as a seed. Electrical signals and power may be transmitted and received through the TSV contact 173.

The TSV contact 173 includes conductive material. For example, the seed layer 175 may include Ti and the conductive layer 177 may include Cu, but the TSV contact is not limited to these materials.

The well 121 may be formed in the second region II of the substrate 110. The well 121 may be flush with the first surface 111. The well 121 may be of an N type or a P type.

The gate 140 may be disposed on the well 121. The gate 140 may include a gate dielectric layer 141, a gate electrode 143, and a hard mask layer 145 stacked one atop the other in the foregoing order on the well 121. The gate dielectric layer 141 may include an oxide layer, and the gate electrode 143 may include a poly silicon layer. A spacer 147 may be disposed on side walls of the gate 140.

A source/drain region 131 may be formed in the well 121 on at least one side of the gate 140. The source/drain region 131 may have source and drain regions spaced apart from each other in the well 121, and may be flush with the first surface 111. Also, if the well is of an N type, the source/drain region 131 is of a P type, while if the well 121 is of a P type, the source/drain region 131 is of an N type.

The device 100 may have a plurality of such wells 121 and gates 142 disposed on the wells 121. For example, as shown in FIG. 1, a plurality of wells 121_1, 121_2, 121_3, 121_4, and 121_5 may be disposed in the second region II, and a plurality of gates 140_1, 140_2, 140_3, 140_4, and 140_5 may be disposed on the wells 121_1, 121_2, 121_3, 121_4, and 121_5, respectively. FIG. 1 illustrates five wells 121 and five gates 140, but it is apparent to those skilled in the art that a much larger number of wells 121 and gates 140 may be provided.

The charging protection well 123 may be formed in the first region I. The charging protection well 123 may be formed in the substrate 110, and may be flush with the first surface 111. Referring to FIG. 1, the charging protection well 123 may surround the TSV hole 170. In any case, the charging protection well 123 is interposed between the TSV hole 170 and the well 121. Also, the charging protection well 123 and the well 121 are spaced apart from each other, and are electrically separated from each other. Accordingly, the TSV hole 170 and the well 121 are spaced apart from each other and are electrically separated from each other. The charging protection well 123 may be formed together when the well 121 is formed, and may be of an N type or a P type.

The charging protection gate 150 is disposed on the charging protection well 123. The charging protection gate 150 may be interposed between the TSV hole 170 and the gate 170, and may be spaced apart from the TSV hole 170 and the gate 170. As shown in FIG. 1, the charging protection gate 150 may surround the TSV hole 170.

The charging protection gate 150 may include a charging protection gate dielectric layer 151, a charging protection gate electrode 153, and a charging protection hard mask layer 155 stacked one atop the other in the foregoing order. A charging protection spacer 157 may be disposed on side walls of the charging protection gate 150. The charging protection gate dielectric layer 151 may be of the same material as the gate dielectric layer 141, and the charging protection gate electrode 153 may be of the same material as the gate electrode 143. The charging protection mask layer 155 may be of the same material as the hard mask layer 145, and the charging protection spacer 157 may be of the same material as the spacer 147.

The interlayer insulating layer 160 is disposed on the substrate 110. The interlayer insulating layer 160 may cover the gate 140 and the charging protection gate 150.

The BEOL (Back-End-Of-Line) structure 180 may be disposed on the interlayer insulating layer 160. The BEOL structure 180 includes a metal interlayer insulating layer 181 and a plurality of multilayer wiring patterns 187 including portions that are insulated by the metal interlayer insulating layer 181. The plurality of multilayer wiring patterns 187 may include a plurality of metal wiring layers 183 and a plurality of contact plugs 185. The plurality of metal wiring layers 183 may extend within the metal interlayer insulating layer 181, and the plurality of contact plugs 185 may electrically connect the plurality of metal wiring layers 183 to each other.

The BEOL structure 180 may include a plurality of wiring structures for electrically connecting individual elements on the substrate 110 or connecting the semiconductor integrated circuit device 100 to another semiconductor integrated circuit device.

The contact 165 includes conductive material and may be disposed on the source/drain region 131. The contact 165 may penetrate the interlayer insulating layer 160 and may electrically connect the plurality of multilayer wiring patterns 187 of the BEOL structure 180 to the source/drain region 131.

In contrast, no contact is disposed on the charging protection well 123. That is, the interlayer insulating layer 160 and the charging protection gate 150 may together cover the entirety of the charging protection well 123. This is because the charging protection well 123 and the charging protection gate 140 do not operate as a semiconductor device. Accordingly, the plurality of multilayer wiring patterns 187 of the BEOL structure 180 are not electrically connected to, i.e., are electrically isolated in the device 100 from, the charging protection well 123 and the charging protection gate 150.

The TSV hole 170 penetrates the interlayer insulating layer 160, and the TSV contact 173 that fills the TSV hole 170 penetrates the interlayer insulating layer 160. The TSV contact 173 may penetrate the interlayer insulating layer 160 and may be electrically connected to the plurality of multilayer wiring patterns 187.

The first connection pad 191 is disposed on the second surface 113 of the substrate 110. The first connection pad 191 may be electrically connected to the TSV contact 173.

The second connection pad 193 is disposed on the BEOL structure 180. The second connection pad 193 may be electrically connected to the plurality of multilayer wiring patterns 187 of the BEOL structure 180.

FIG. 1 illustrates only one TSV hole 170. However, it will be apparent to those skilled in the art that the semiconductor integrated circuit device 100 may include a plurality of TSV holes 170. In the case in which several TSV holes 170 are provided, a plurality of charging protection wells 123 and a plurality of charging protection gates 150, which surround the TSV holes 170, are provided. One respective charging protection well 123 and one respective charging protection gate 140 may surround each TSV hole 170.

In this embodiment of a semiconductor integrated circuit device 100 according to the inventive concept, the charging protection well 123 and charging protection gate 150 are interposed between the TSV hole 170 and the well 121 and gate 140.

Figure 3:
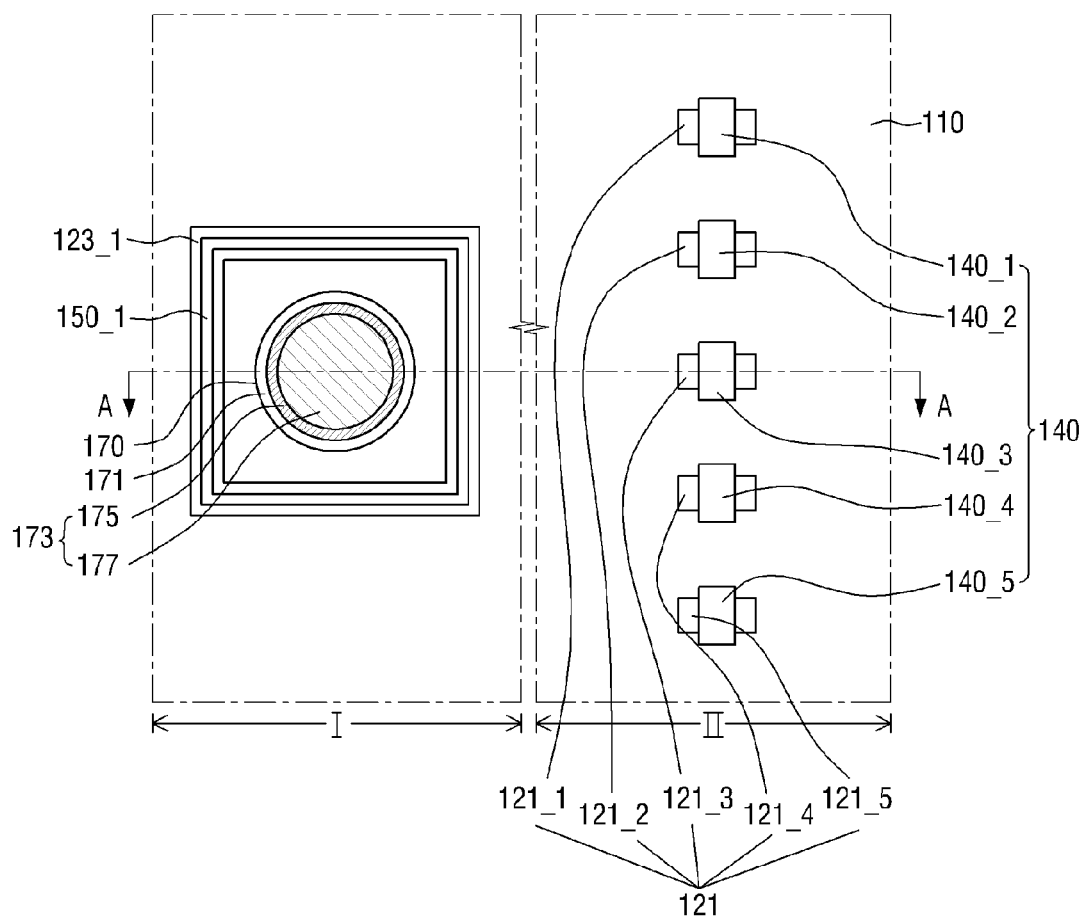
FIG. 3 is a plan view of another embodiment of a semiconductor integrated circuit device according to the inventive concept.

FIG. 3 shows another embodiment of a semiconductor integrated circuit device 101 according to the inventive concept. However, for the sake of brevity mainly only the differences between the semiconductor integrated circuit device 101 and the first embodiment of the semiconductor integrated circuit device 100 will be described. Also, a BEOL structure 180, a second connection pad 193, a contact 165, and an interlayer insulating layer 160 are omitted from FIG. 3 for simplicity.

The semiconductor integrated circuit device 101 according to another embodiment of the inventive concept is different from the semiconductor integrated circuit device 100 of FIG. 1 in terms of the shape of its charging protection well 123_1 and charging protection gate 150_1. Specifically, in the semiconductor integrated circuit device 100 of FIG. 1, the respective distances between each of the charging protection well 123 and charging protection gate 150 and the TSV hole 170 are uniform. For example, in FIG. 1, the charging protection well 123 and the charging protection gate 150 are annular so as to have inner peripheral surfaces having generally circular cross sections, and the cross section of the TSV hole 170 is circular. However, in the semiconductor integrated circuit device 101 of FIG. 2, although the charging protection well 123_1 and the charging protection gate 150_1 surround the TSV hole 170 as in the semiconductor integrated circuit device 100 of FIG. 1, the charging protection well 123_1 and the charging protection gate 150_1 each have a shape different from that of the TSV hole 170. For example, as shown in FIG. 2, the charging protection well 123_1 and the charging protection gate 150_1 may each have the shape of a rectangular column so as to have inner and outer peripheral surfaces whose cross sections are rectangular. However, since the charging protection well 123_1 and the charging protection gate 150_1 are both interposed between the TSV hole 170 and the gate 140 even in the semiconductor integrated circuit device 101 of FIG. 2, the semiconductor integrated circuit device 101 of FIG. 2 provides the same effect as the semiconductor integrated circuit device 100 of FIG. 1.

Figure 4:
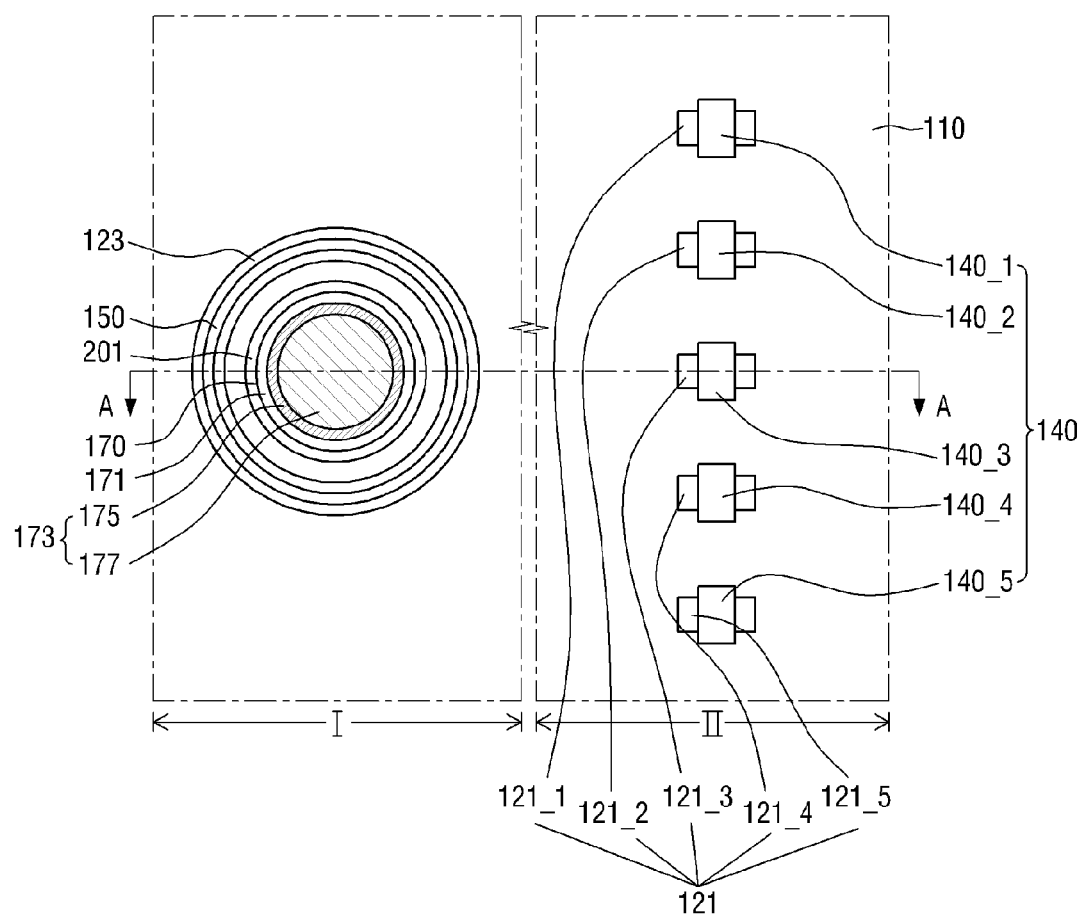
FIG. 4 is a plan view of still another embodiment of a semiconductor integrated circuit device according to the inventive concept.
Figure 5:
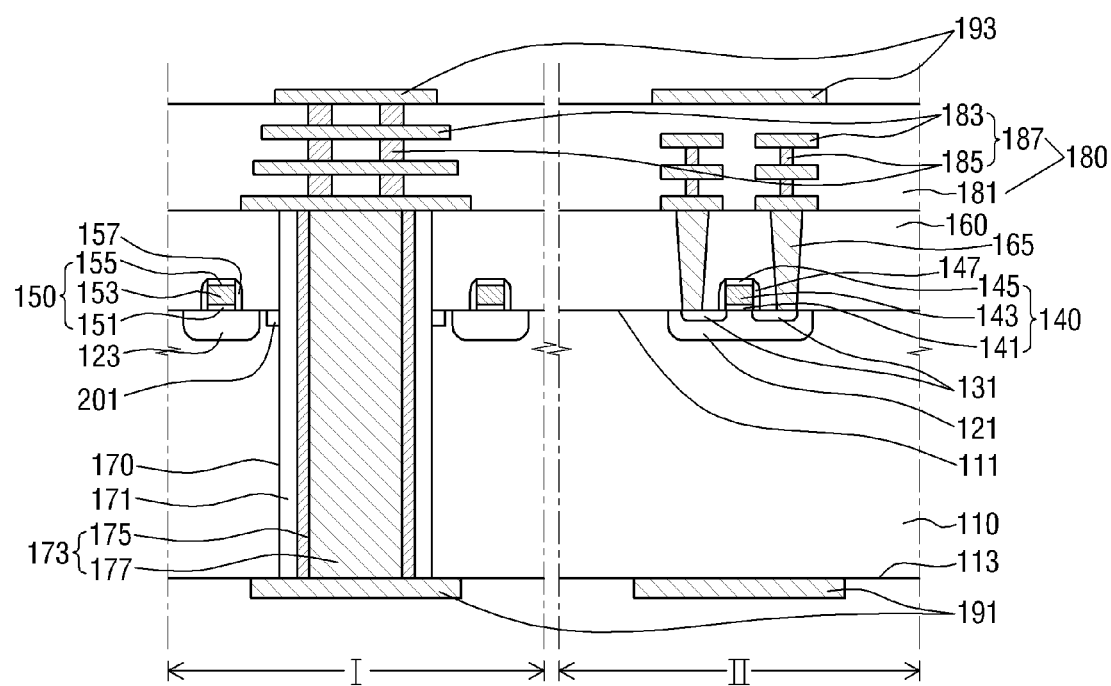
FIG. 5 is a cross-sectional view taken along line A-A of FIG. 4.

Another embodiment of a semiconductor integrated circuit device 102 according to the inventive concept is shown in FIGS. 4 and 5. However, for the sake of brevity mainly only the differences between the semiconductor integrated circuit device 102 and the first embodiment of the semiconductor integrated circuit device 100 will be described. Also, a BEOL structure 180, a second connection pad 193, a contact 165, and an interlayer insulating layer 160 are omitted from FIG. 4 for simplicity.

Unlike the semiconductor integrated circuit device 100 of FIG. 1, the semiconductor integrated circuit device 102 of FIGS. 4 and 5 further includes a field insulating layer 201. Specifically, the field insulating layer 201 surrounds the TSV hole 170. The field insulating layer 201 may be disposed in the substrate 110 between the TSV hole 170 and the charging protection well 123. The field insulating layer 201 may include, for example, an oxide layer.

FIG. 5 illustrates that a side wall of the field insulating layer 201 contacts the TSV hole 170. However, the field insulating layer 201 may instead be spaced apart from the TSV hole 170.

Figure 6:
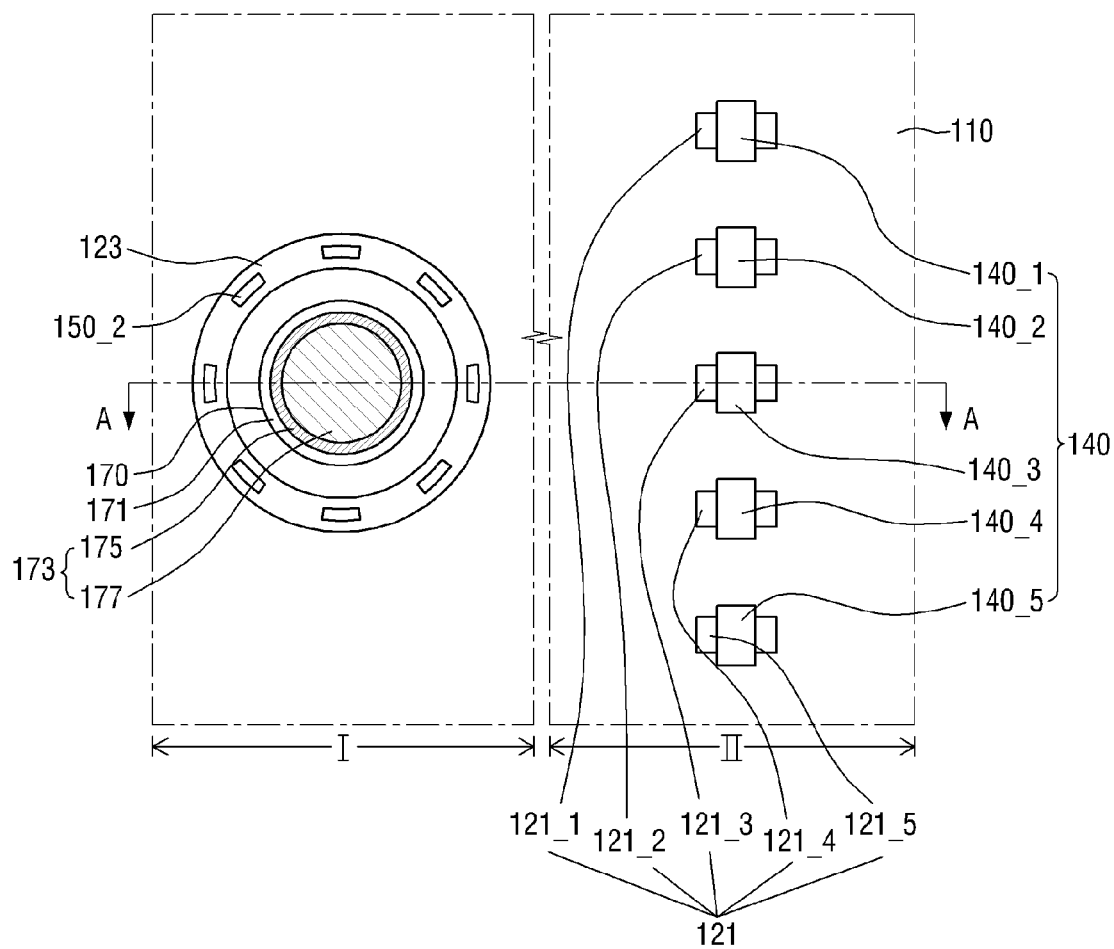
FIG. 6 is a plan view of still another embodiment of a semiconductor integrated circuit device according to the inventive concept.

Another embodiment of a semiconductor integrated circuit device 103 according to the inventive concept is shown in FIG. 6. However, for the sake of brevity mainly only the differences between the semiconductor integrated circuit device 103 and the first embodiment of the semiconductor integrated circuit device 100 will be described. Also, a BEOL structure 180, a second connection pad 193, a contact 165, and an interlayer insulating layer 160 are omitted from FIG. 6 for simplicity.

The semiconductor integrated circuit device 103 of FIG. 6 is different from the semiconductor integrated circuit device 100 of FIG. 1 in terms of the shape of the charging protection gate 150_2. Specifically, in the semiconductor integrated circuit device 100 of FIG. 1, the charging protection gate 150 surrounds the TSV hole 170, but in the semiconductor integrated circuit device 103 of FIG. 6, the charging protection gate 150_2 has a plurality of segments spaced from each other along a path surrounding the TSV hole 170. In this respect, each of the segments of the charging protection gate 150_2 may be spaced the same distance from the TSV hole 170. In the example shown in FIG. 4, the segments of the charging protection gate 150_2 may be inscribed by an annulus, i.e., a circular band.

Figure 7:
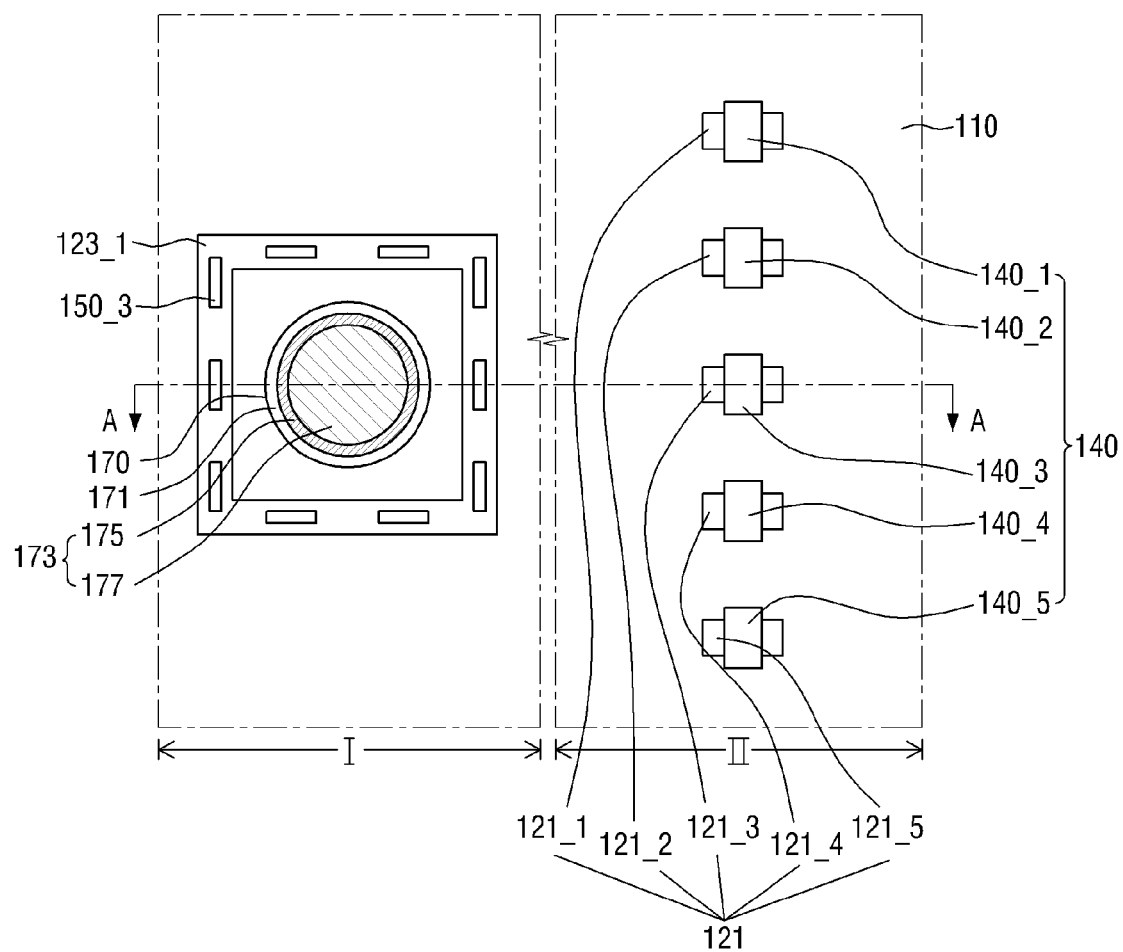
FIG. 7 is a plan view of still another embodiment of a semiconductor integrated circuit device according to the inventive concept.

Still another embodiment of a semiconductor integrated circuit device 104 according to the inventive concept is shown in FIG. 7. However, for the sake of brevity mainly only the differences between the semiconductor integrated circuit device 104 and the first and second embodiments of the semiconductor integrated circuit device 100 and 101 will be described. Also, a BEOL structure 180, a second connection pad 193, a contact 165, and an interlayer insulating layer 160 are omitted from FIG. 7 for simplicity.

The semiconductor integrated circuit device 104 of FIG. 7 is different from the semiconductor integrated circuit device 101 of FIG. 3 in terms of the shape of its charging protection gate 150_3. Specifically, in the semiconductor integrated circuit device 101 of FIG. 3, the charging protection gate 150 is contiguous and surrounds the TSV hole 170, but in the semiconductor integrated circuit device 104 of FIG. 7, the charging protection gate 150_3 like that of the charging protection gate 150_2 of the embodiment of FIG. 6 has a plurality of discrete segments spaced from one another around the TSV hole 170. Thus, the segments of the charging protection gate 150_3 may be inscribed by a rectangular band.

Figure 8:
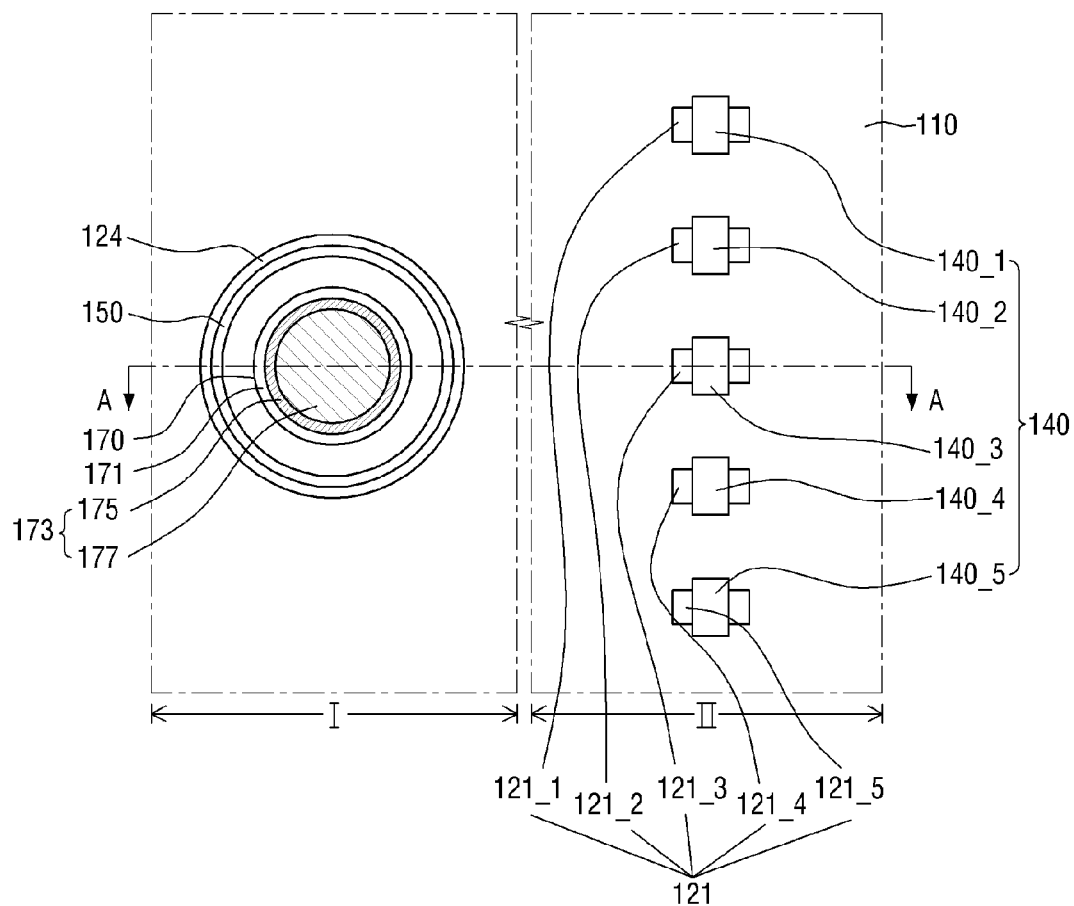
FIG. 8 is a plan view of still another embodiment of a semiconductor integrated circuit device according to the inventive concept.
Figure 9:
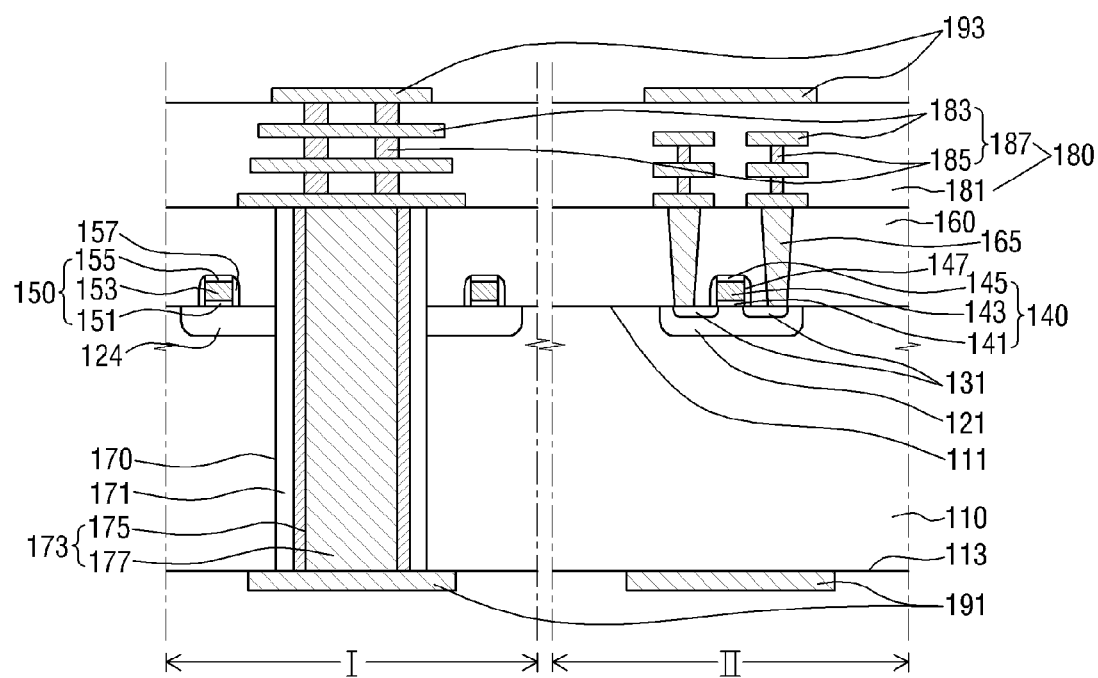
FIG. 9 is a cross-sectional view taken along line A-A of FIG. 8.

Still another embodiment of a semiconductor integrated circuit device 105 according to the inventive concept is shown in FIGS. 8 and 9. However, for the sake of brevity mainly only the differences between the semiconductor integrated circuit device 101 and the first embodiment of the semiconductor integrated circuit device 100 will be described. Also, a BEOL structure 180, a second connection pad 193, a contact 165, and an interlayer insulating layer 160 are omitted from FIG. 8 for simplicity.

The semiconductor integrated circuit device 105 of FIGS. 8 and 9 is different from the semiconductor integrated circuit device 100 of FIG. 1 in terms of the configuration of its charging protection well 124. Specifically, in the semiconductor integrated circuit device 100 of FIG. 1, the charging protection well 121 is spaced from the TSV hole 170, but in the semiconductor integrated circuit device 105 of FIG. 8, the charging protection well 124 can be seen as extending to and hence, delimiting part of, the TSV hole 170. Therefore, the charging protection well 124 and the separation layer 171 may contact each other.

Even though the charging protection well 124 extends to the TSV hole 170, the charging protection gate 150 may be spaced apart from the TSV hole 170 on the charging protection well 124.

Figure 10:
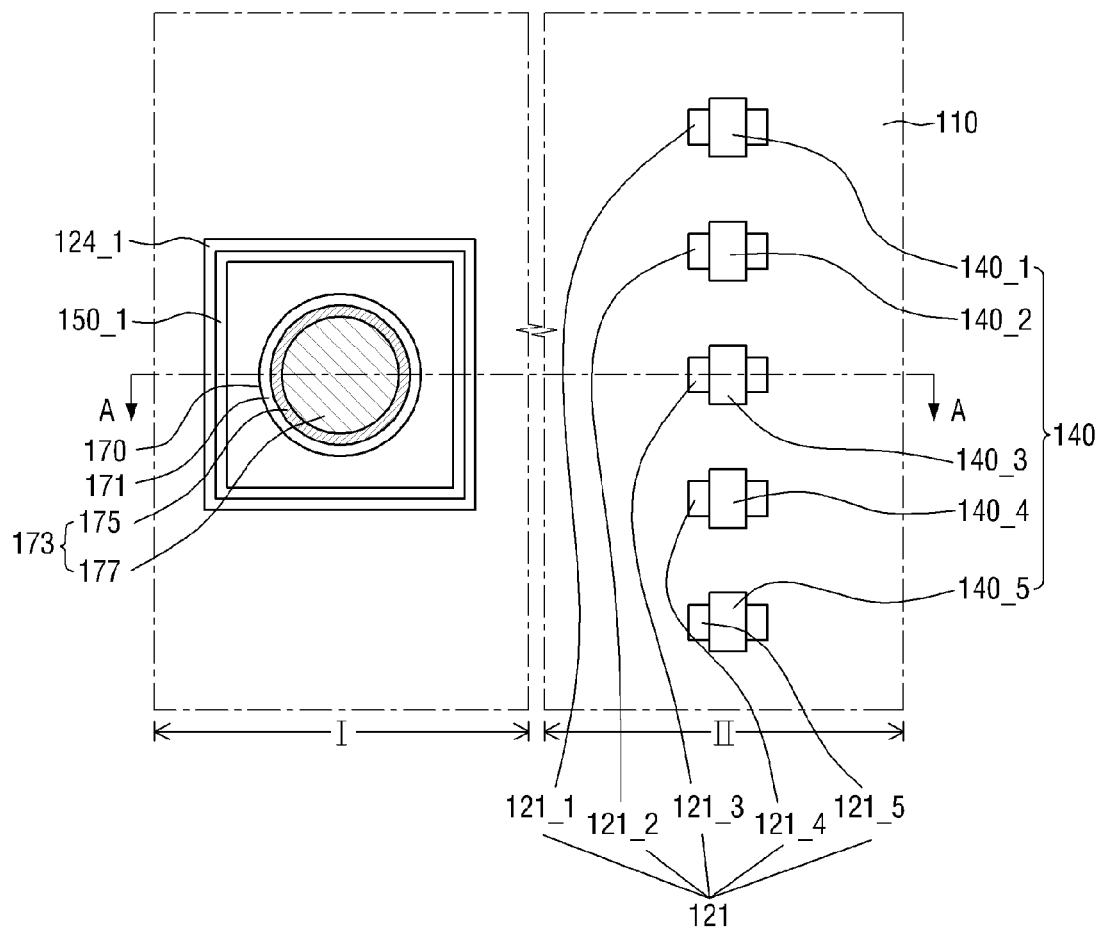
FIG. 10 is a plan view of still another embodiment of a semiconductor integrated circuit device according to the inventive concept.

Still another embodiment of a semiconductor integrated circuit device 106 according to the inventive concept is shown in FIG. 10. However, for the sake of brevity mainly only the differences between the semiconductor integrated circuit devices 106 and the first and second embodiments of the semiconductor integrated circuit device 100 and 101 will be described. Also, a BEOL structure 180, a second connection pad 193, a contact 165, and an interlayer insulating layer 160 are omitted from FIG. 10 for simplicity.

The semiconductor integrated circuit device 106 of FIG. 10 is different from the semiconductor integrated circuit device 101 of FIG. 3 in terms of the configuration of its charging protection well 124_1. Specifically, in the semiconductor integrated circuit device 101 of FIG. 3, the charging protection well 121 surrounds the TSV hole 170 but is spaced apart from the TSV hole 170. However, in the semiconductor integrated circuit device 106 of FIG. 10, the charging protection well 124_1 extends to, i.e., delimits part of, the TSV hole 170. That is, like the semiconductor integrated circuit device 105 of FIG. 9, a side wall of the charging protection well 124_1 is an extension of the side of the TSV hole 170. Accordingly, the charging protection well 124_1 and the separation layer 171 may contact each other.

Even though the charging protection well 124_1 extends to the TSV hole 170, the charging protection gate 150 may be spaced apart from the TSV hole 170 on the charging protection well 124_1.

Figure 11:
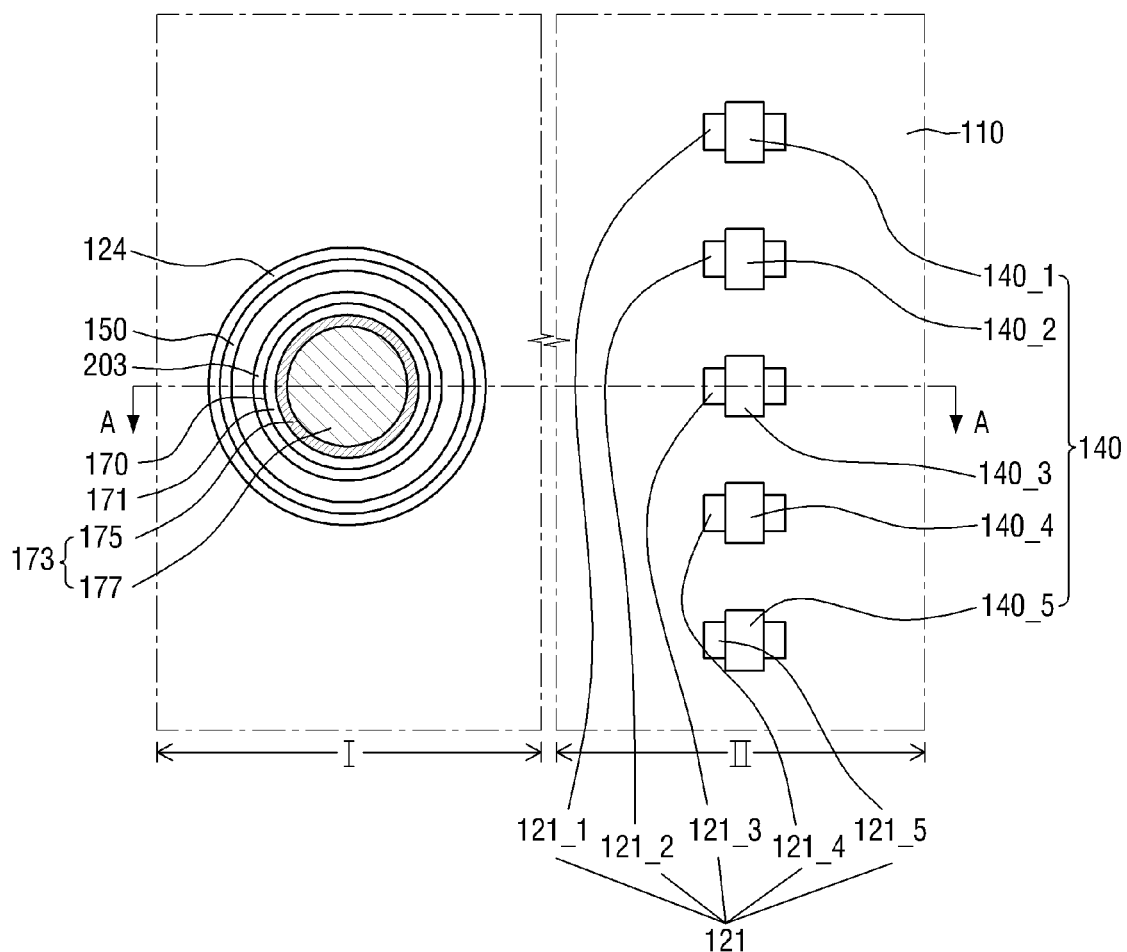
FIG. 11 is a plan view of still another embodiment of a semiconductor integrated circuit device according to the inventive concept.
Figure 12:
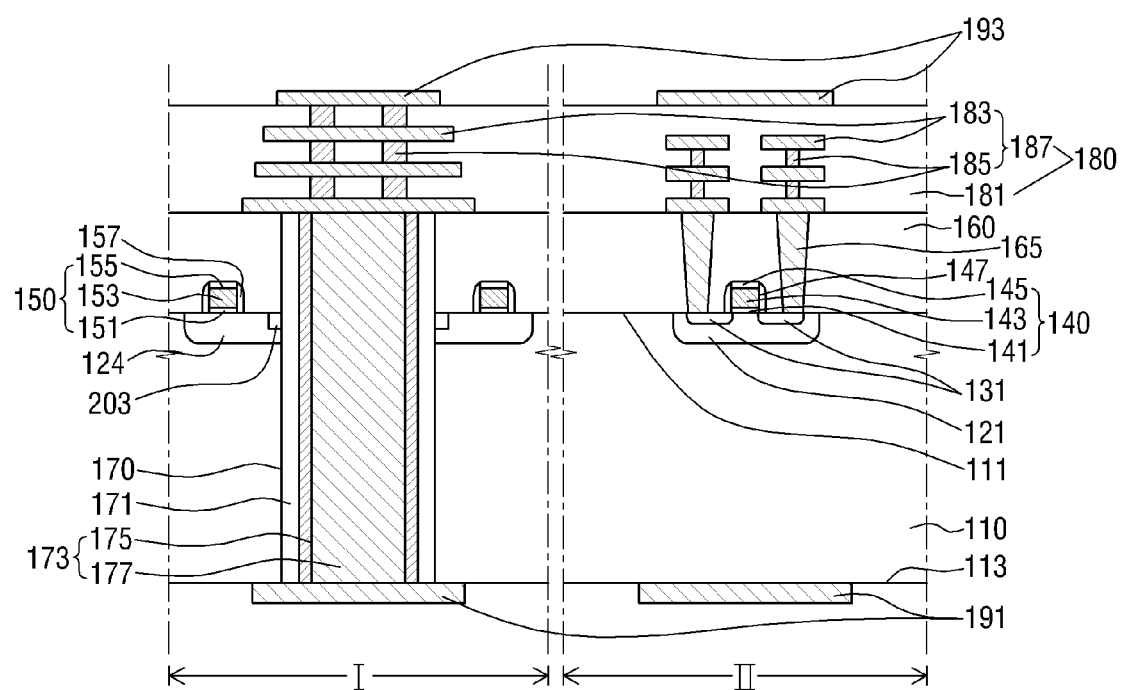
FIG. 12 is a cross-sectional view taken along line A-A of FIG. 11.

Still another embodiment of a semiconductor integrated circuit device 107 according to the inventive concept is shown in FIGS. 11 and 12. However, for the sake of brevity mainly only the differences between the semiconductor integrated circuit device 107 and the first and fifth embodiments of the semiconductor integrated circuit device 101 and 105 will be described. Also, a BEOL structure 180, a second connection pad 193, a contact 165, and an interlayer insulating layer 160 are omitted from FIG. 11 for simplicity.

Unlike the semiconductor integrated circuit device 105 of FIG. 8, the semiconductor integrated circuit device 107 of FIGS. 11 and 12 further includes a field insulating layer 203. Specifically, the field insulating layer 203 of FIG. 11 may be formed in the charging protection well 124. The field insulating layer 203 may surround the TSV hole 170 and may extend to the TSV hole 170. Both a side wall of the charging protection well 124 and a side wall of the field insulating layer 203 may extend to, i.e., may delimit parts of, the side of the TSV hole 170. The field insulating layer 203 may be, for example, an oxide layer.

Figure 13:
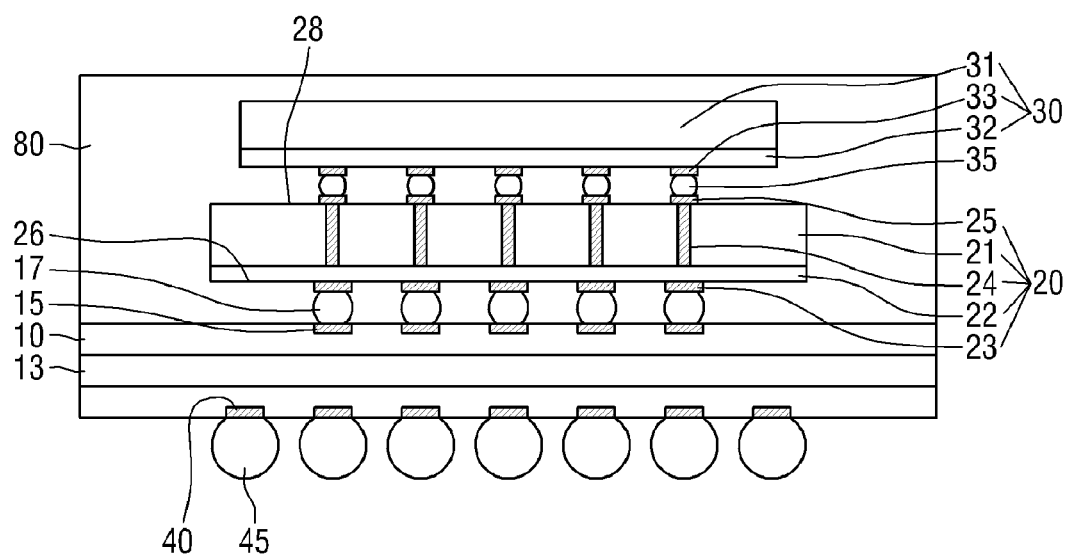
FIG. 13 is a cross-sectional view of an embodiment of a semiconductor package that includes a semiconductor integrated circuit device according to the inventive concept.

An embodiment of a semiconductor package 1 according to the inventive concept will now be described with reference to FIG. 13. The semiconductor package 1 includes any of the semiconductor integrated circuit devices 100 to 107 described above.

More specifically, the semiconductor package 1 includes a package substrate 10, a first semiconductor integrated circuit device 20, a second semiconductor integrated circuit device 30, and a molding layer 80.

The package substrate 10 may include a substrate which is made of glass, ceramic, or plastic, upper and lower printed circuits on upper and lower surfaces of the substrate, respectively, and an intermediate layer 13 that includes internal redistribution wiring connecting the printed circuits on the surfaces of the substrate, but the package substrate is not limited to having such a structure. External terminals 45 that serve to electrically connect the semiconductor package 1 to an external device (not illustrated) may be provided on a lower surface of the package substrate 10. The external terminals 45 may be arrayed in a grid, and may be pins, balls or lands of conductive material so as to constitute a pin grid array, a ball grid array, or a land grid array. Package lower pads 40 of the lower printed circuit may be electrically connected to the external terminals 45, and fourth pads 15 of the printed circuit may be provided on the upper surface of the package substrate 10. In this case, the package substrate 10 may supply an electrical signal from the external terminals 45 to the first semiconductor integrated circuit device 20 and the second integrated circuit device 30 through the lower pads 40, the wiring of layer 13, and the fourth pads 15, and vice versa. At least one of the package lower pads 40 may be, for example, a ground pad, and may be electrically connected to a ground line in the package substrate 10. FIG. 9 illustrates that the package lower pads 40 are confined to a central portion of the lower surface of the substrate, but the package 1 is not limited to such an arrangement of the lower pads 40.

The first semiconductor integrated circuit device 20 and the second semiconductor integrated circuit device 30 may be sequentially stacked on the package substrate 10. Specifically, the first semiconductor integrated circuit device 20 may be disposed on the package substrate 10, and the second semiconductor integrated circuit device 30 may be disposed on the first semiconductor integrated circuit device 20. The first semiconductor integrated circuit device 20 and the second semiconductor integrated circuit device 30 may, for example, have the form of a flip chip device.

The second semiconductor integrated circuit device 30 and the first semiconductor integrated circuit device 20 may be, for example, memory chips or logic chips. Various types of logic chips may be provided by either or both of the second semiconductor integrated circuit device 30 and the first semiconductor integrated circuit device 20. For example, the logic chip may constitute a microprocessor, and may be, for example, a CPU (Central Processing Unit), a controller, or an ASIC (Application Specific Integrated Circuit). On the other hand, memory chips comprising various types of memories may be provided by the second semiconductor integrated circuit device 30 and/or the first semiconductor integrated circuit device 20, e.g., volatile memories such as a DRAM or SRAM, or a nonvolatile memory such as a flash memory. More specifically, the second semiconductor integrated circuit device 30 and/or the first semiconductor integrated circuit device 20 may be a NOR flash memory chip. Other examples of the memories that may be provided by the second semiconductor integrated circuit device 30 and/or the first semiconductor integrated circuit device 20 include a PRAM (Phase-change Random-Access Memory), MRAM (Magneto-resistive Random-Access Memory), and RRAM (Resistive Random-Access Memory). However, the package 1 of the inventive concept is not limited to having a chip providing any particular type of memory.

The first semiconductor circuit device 20 is disposed on the package substrate 10. The first semiconductor integrated circuit device 20 may comprise any one of the types of semiconductor integrated circuit devices 100 to 107 according to the inventive concept. Accordingly, the first semiconductor integrated circuit device 20 may include a substrate 21, a TSV contact 24, a BEOL structure 22, a second connection pad 25, and a first connection pad 23, and a charging protection well, a charging protection gate, a well, and a gate. These features have been shown in and described in detail in FIGS. 1-12 and thus, for the sake of brevity, will not be described in detail again here.

The second connection pad 25 that is disposed on a second surface 28 may be electrically connected to a connection pad 33 of the second semiconductor integrated circuit device 30, and the second connection pad 25 may be electrically connected to the TSV contact 24. Accordingly, the first semiconductor integrated circuit device 20 and the second semiconductor integrated device 30 may be electrically connected to each other through the TSV contact 24.

In the illustrated embodiment of the package 1, the first semiconductor integrated circuit device 20 is shown as a single chip. However, this is merely exemplary, and the first semiconductor integrated circuit device 20 may instead be a multi-chip device.

The first semiconductor integrated circuit device 20 may be electrically connected to the package substrate 10 through the first connection pad 23 that is formed on a first surface 26. Specifically, a first bump 17 is interposed between the first connection pad 23 and the package substrate upper pad 15 to electrically connect the first connection pad 23 and the package substrate upper pad 30 to each other.

The first semiconductor integrated circuit device 20 is electrically connected to the second semiconductor integrated circuit device 30 within the package 1. To this end, the second connection pad 25 of the first semiconductor integrated circuit device 20 may be connected to the connection pad 33 of the second semiconductor integrated circuit device 20 through a second bump 35. The second semiconductor integrated circuit device 30 may include a substrate 31 and a semiconductor integrated circuit 32, and the connection pad 33 may be formed on the surface of the second semiconductor integrated circuit device 30 on which the semiconductor integrated circuit 32 is formed.

Furthermore, the second semiconductor integrated circuit device 30 may be electrically connected to the package substrate 10 through the medium of the TSV contact 24 of the first semiconductor integrated circuit device 20. Specifically, the second semiconductor integrated circuit device 30 may be electrically connected to the package substrate 10 through the connection pad 33, the second connection pad 25, the TSV contact 24, the first connection pad 23, and the package substrate upper pad 15.

In the illustrated embodiment of the package 1, the second semiconductor integrated circuit device 30 is a single chip. However, this is merely exemplary, and the second semiconductor integrated circuit device 30 may instead be a multi-chip device.

The molding layer 80 may be formed to cover the first and second semiconductor integrated circuit devices 20 and 30 on the package substrate 10. The molding layer 80 may protect the first and second semiconductor integrated circuit devices 20 and 30 from external influences such as contaminants or shock. The molding layer 80 may include, for example, EMC (Epoxy Molding Compound) or two or more kinds of silicon hybrid materials.

Figure 14:
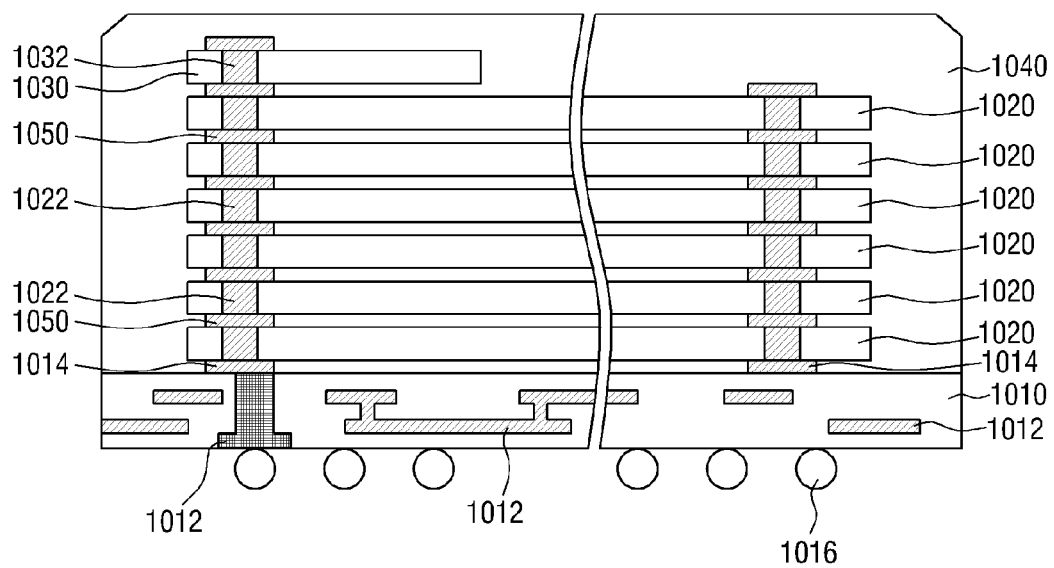
FIG. 14 is a cross-sectional view of an integrated circuit device according to the inventive concept, illustrating the main configuration of the device.

An embodiment of an integrated circuit device 1000 according to the inventive concept is shown in FIG. 14.

Referring to FIG. 14, the integrated circuit device 1000 includes a plurality of semiconductor chips 1020 that are sequentially stacked on a package substrate 1010. A control chip 1030 may be disposed on and electrically connected to the plurality of semiconductor chips 1020. In another embodiment, the control chip 1030 is omitted.

The stacked structure of the plurality of semiconductor chips 1020 and the control chip 1030 is encapsulated by an encapsulant 1040, such as thermosetting resin, on the package substrate 1010. FIG. 14 illustrates one vertical stack of six semiconductor chips 1020, but the device 1000 may have other numbers of semiconductor chips 1020, i.e., more than or less than six chips, as well as an additional chip or stack of chips. For example, the plurality of semiconductor chips 1020 may be disposed in two or more groups spaced from each other in a horizontal direction on package substrate 1010 and at least one of which groups includes a vertical stack of the chips 1020.

The package substrate 1010 may be a flexible printed circuit board, a rigid printed circuit board, or a combination thereof. The package substrate 1010 is provided with a substrate inner wiring 1012 and a connection terminal 1014. Only one surface of the package substrate 1010 may be provided with such a connection terminal 1014. A solder ball 1016 is disposed on the other surface of the package substrate 1010. The connection terminal 1014 is electrically connected to the solder ball 1016 through the substrate inner wiring 1012.

Alternatively, the device 1000 may have a conductive bump or an LGA (Lead Grid Array) instead of a solder ball 1016.

At least one of the semiconductor chips 1020 and the control chip 1030 in the stack is a semiconductor integrated circuit device 100 to 107 of a type described above with reference to FIGS. 1 to 12. However, for simplicity, FIG. 14 does not show the charging protection well and charging protection gate that surround the TSV contact of the semiconductor integrated circuit device. In this example, the plurality of semiconductor chips 1020 and the control chip 1030 include TSV contacts 1022 and 1032, and at least one of the TSV contacts 1022 and 1032 is similar to the TSV contact 173 of any of the embodiments of FIGS. 1 to 12.

The TSV contacts 1022 and 1032 of the plurality of semiconductor chips 1020 and the control chip 1030 may be electrically connected to the connection terminal 1014 of the package substrate 1010 through a connection member 1050. The connection member 1050 may have the form of the connection pads 191 and 193 as described above with reference to FIGS. 1 to 12.

In the embodiment of this device 1000, the semiconductor chip 1020 may constitute a system LSI, a flash memory, DRAM, SRAM, EEPROM, PRAM, MRAM, or RRAM. Further, the control chip 1030 may include a logic circuit, such as a SER/DES (Serializer/Deserializer).

Figure 15:
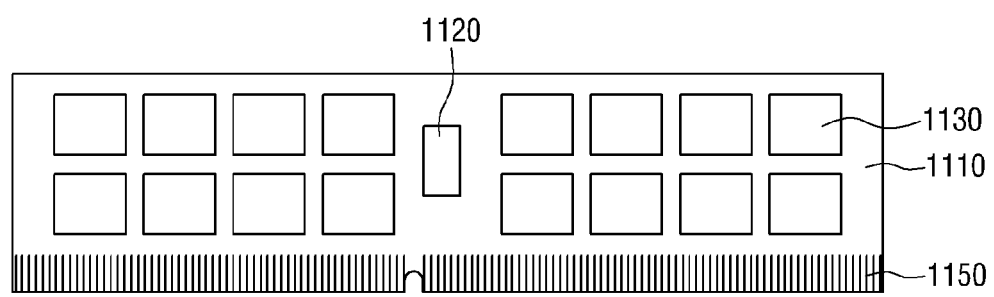
FIG. 15 is a plan view of an integrated circuit device module according to the inventive concept, illustrating the main configuration of the module.

FIG. 15 illustrates another embodiment of an integrated circuit device 1100 according to the inventive concept.

Referring to FIG. 15, the integrated circuit device 1100 includes a module substrate 1110, a control chip 1120 and a plurality of semiconductor packages 1130 mounted on the module substrate.

At least one of the of semiconductor packages 1130 may be a semiconductor package of the type described above with reference to FIG. 13.

Figure 16:
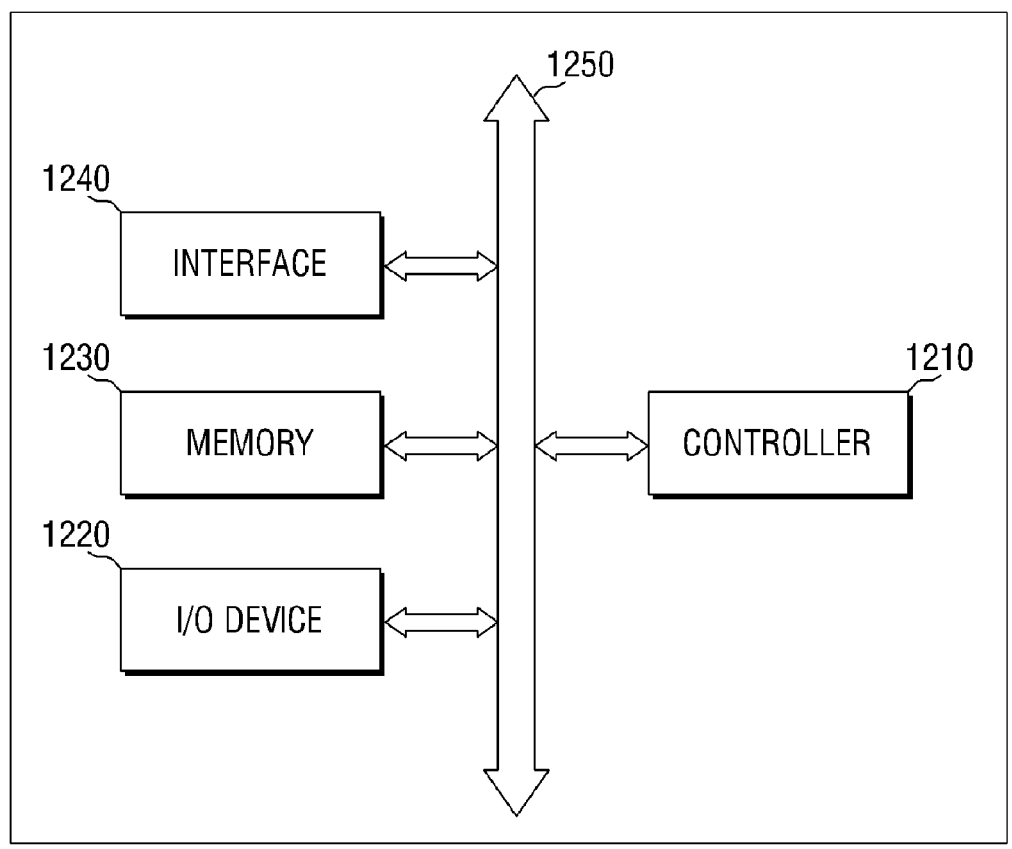
FIG. 16 is a block diagram of an integrated circuit device according to the inventive concept.

FIG. 16 is a diagram illustrating the main configuration of an integrated circuit device 1200 according to an embodiment of the inventive concept.

The integrated circuit device 1200 includes a controller 1210, an input/output (I/O) device 1220, a memory 1230, and an interface 1240. The integrated circuit device 1200 may be employed by a PDA (Personal Digital Assistant), a portable computer, a web tablet, a wireless phone, a mobile phone, a digital music player, or a memory card, i.e., may be part of a mobile system or a system that transmits or receives information. Similarly, the integrated circuit device 1200 may be employed by an MP3 player, a navigation system, a PMP (Portable Multimedia Player), a SSD (Solid State Drive) or a household appliance.

The controller 1210 may be a microprocessor, a digital signal processor, or a microcontroller.

The I/O device 1220 is used to input/output data of the integrated circuit device 1200. The integrated circuit device 1200 may be connected to an external device, for example, a personal computer or a network, using the I/O device 1220, and may exchange mutual data with the external device. The I/O device 1220 may be a keypad, a keyboard, or a display.

In one example of this embodiment, the memory 1230 stores codes for operating the controller 1210 and/or data. In another example of this embodiment, the memory 1230 stores data that is processed by the controller 1210. At least one of the controller 1210 and the memory 1230 includes a semiconductor integrated circuit device(s) of any of the types described above with reference to FIGS. 1 to 12.

The interface 1240 serves as a data transfer path between the integrated circuit device 1200 and other external devices. The controller 1210, the I/O device 1220, the memory 1230, and the interface 1240 may communicate with each other through a bus 1250.

An embodiment of a method of fabricating a semiconductor integrated circuit device according to the inventive concept will now be described Referring to FIGS. 17 to 25.

Figure 17:
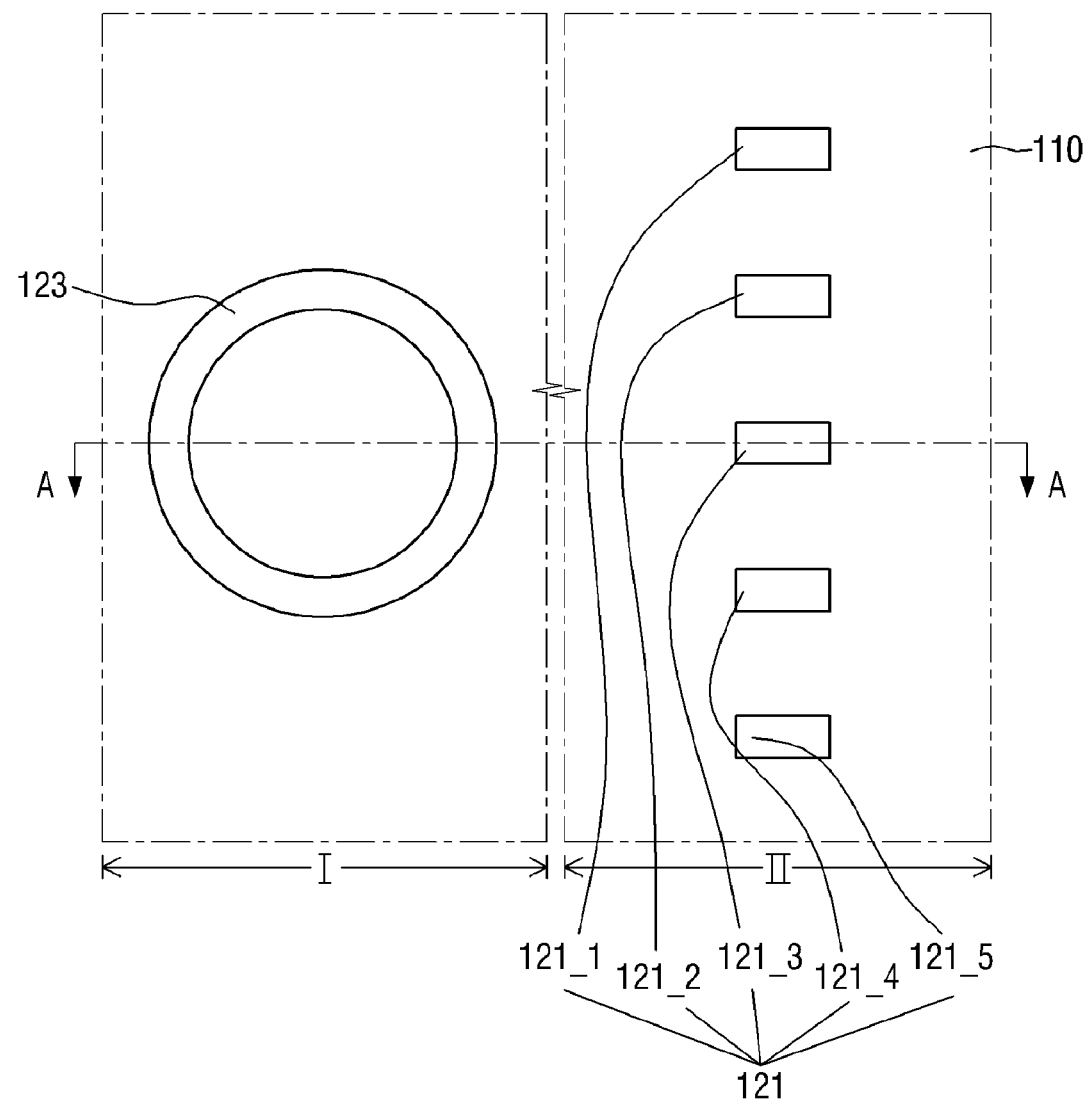
Figure 18:
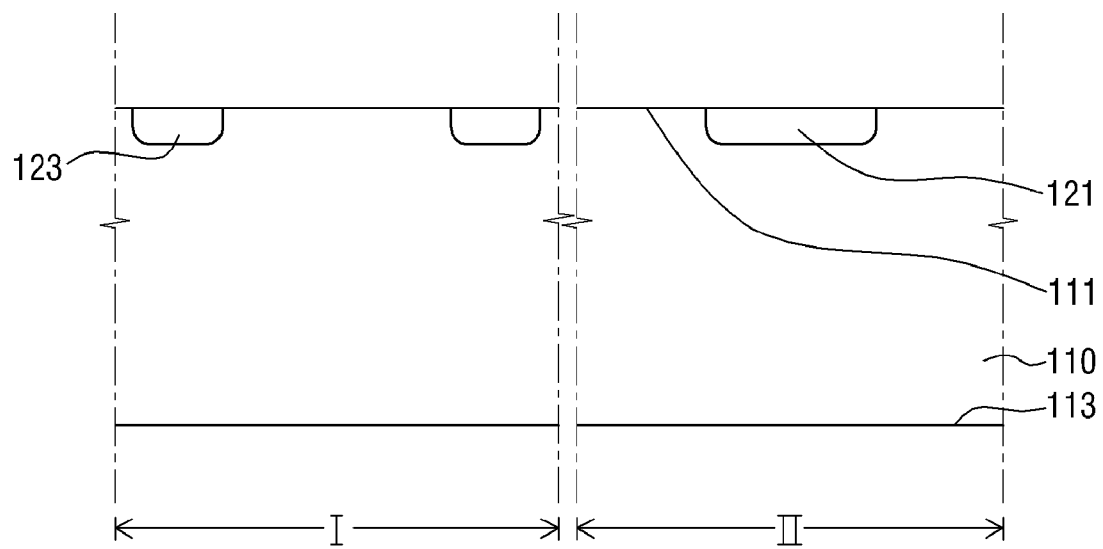

First, referring to FIGS. 17 and 18, a substrate 110 that includes a first region I and a second region II is provided. Here, the first region I may be a region where a TSV hole is formed, and the second region II may be a region where a gate is formed.

Then, a charging protection well 123 is formed in the first region I, and a well 121 is formed in the second region II. The charging protection well 123 and the well 121 may be formed in the substrate 110. The substrate 110 has a first surface 111 and a second surface 113 that is opposite to the first surface 111, and the charging protection well 123 and the well 121 may be formed such that its upper surface is flush and contiguous with the first surface 111. The charging protection well 123 and the well 121 may be formed to be spaced apart from each other. The charging protection well 123 may be in the shape of a circular band as shown in FIG. 17, and a plurality of wells 121 may be formed in the second region II. FIG. 17 illustrates five wells 121_1, 121_2, 121_3, 121_4, and 121_5, but the inventive concept is not limited thereto.

Figure 19:
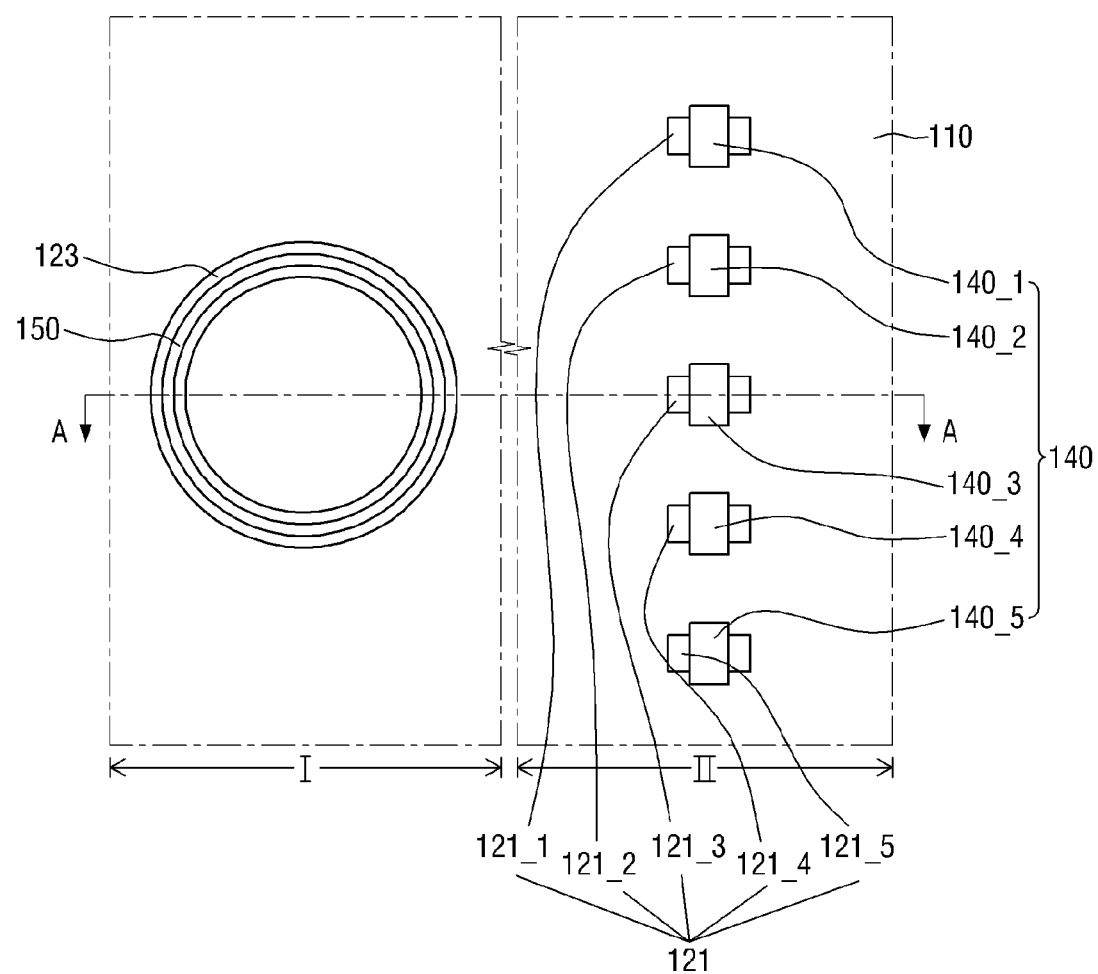
Figure 20:
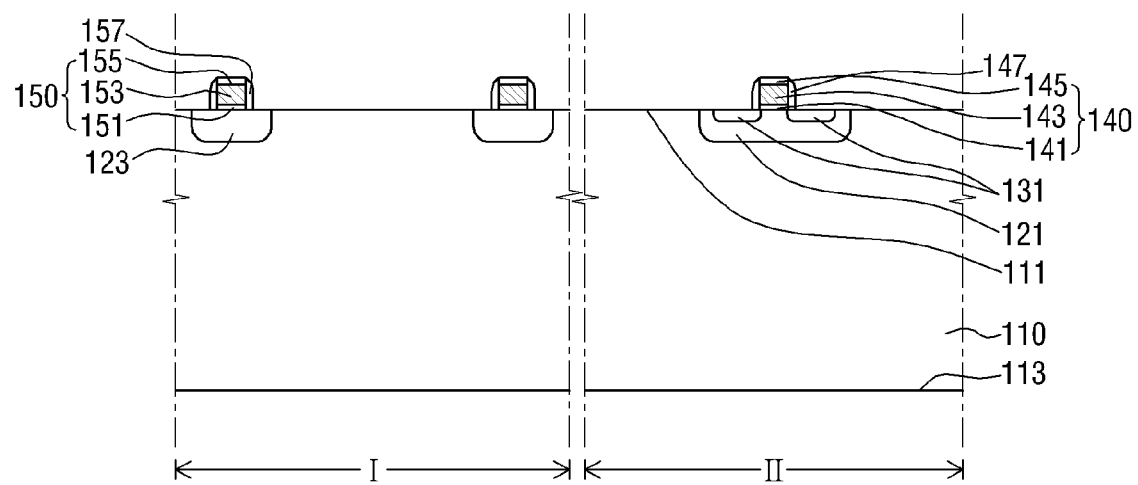

Referring to FIGS. 19 and 20, a charging protection gate 150 is formed on the charging protection well 123, and a gate 140 is formed on the well 121. The charging protection gate 150 may be simultaneously formed when the gate 140 is formed. Furthermore, the charging protection gate 150 may be formed in the same shape as the charging protection well 123. For example, as shown in FIG. 19, the charging protection gate 150 may be in the shape of a circular band.

The gate 140 may be formed by sequentially forming a gate dielectric layer 141, a gate electrode 143, and a hard mask layer 145 on the well 121. The gate dielectric layer 141 may comprise, for example, an oxide layer, and the gate electrode 143 may comprise, for example, a poly silicon layer. A spacer 147 may be formed on a side wall of the gate 140.

A source/drain region 131 may be formed in the well 121 on at least one side of the gate 140. The source/drain region 131 may comprise source and drain regions spaced apart from each other in the well 121 on opposite sides of the gate 140, and may be formed such that their upper surfaces are contiguous and coplanar with the upper surface of the well 121 and coplanar with the first surface 111 of the substrate 110. If the well is of an N type, the source/drain region 131 may be of a P type, while if the well 121 is of a P type, the source/drain region 131 may be of an N type.

The charging protection gate 150 may be formed by sequentially forming a charging protection gate dielectric layer 151, a charging protection gate electrode 153, and a charging protection hard mask layer 155. A charging protection spacer 157 may be formed on a side wall of the charging protection gate 150. The charging protection gate dielectric layer 151 may be formed of the same material as the gate dielectric layer 141, and the charging protection gate electrode 153 may be formed of the same material as the gate electrode 143. The charging protection mask layer 155 may be formed of the same material as the hard mask layer 145, and the charging protection spacer 157 may be formed of the same material as the spacer 147.

Figure 21:
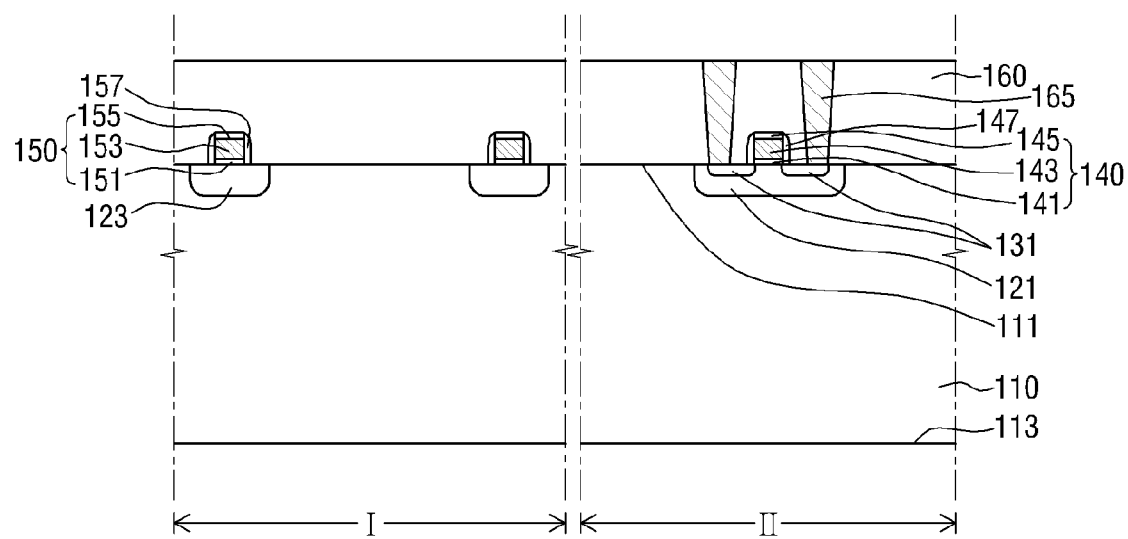

Referring to FIG. 21, an interlayer insulating layer 160 that covers the charging protection gate 150 and the gate 140 is formed on the substrate 110. The interlayer insulating layer 160 may be formed on the first surface 111 of the substrate 110.

Then, a contact 165 is formed through the interlayer insulating layer 160, on the well 121. The contact 165 is formed to be electrically connected to the source/drain region 131. At this time, an upper surface of the contact 165 is exposed.

Figure 22:
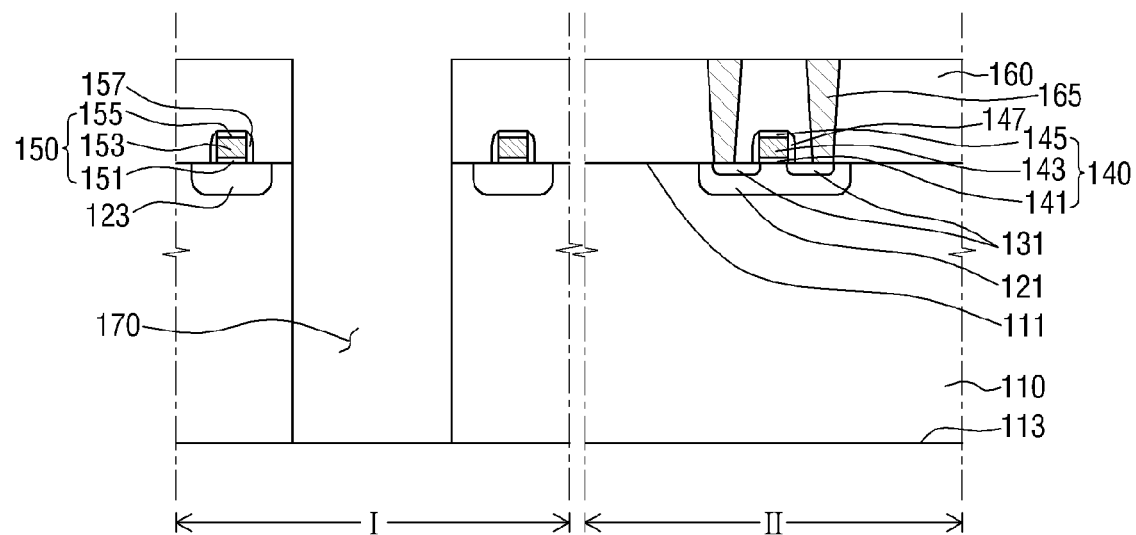

Referring to FIG. 22, a TSV hole 170 is formed to extend through the charging protection well 123. The TSV hole 170 may be formed to be spaced apart from the charging protection well 123 and the charging protection gate 150. The TSV hole 170 may be formed in the first region I of the substrate 110. The TSV hole 170 may be surrounded by the charging protection well 123 and the charging protection gate 150. The TSV hole 170 may be formed through the interlayer insulating layer 160 and into the substrate 110. Note, the solid line at the bottom of the TSV hole 170 is intended to show that the hole 170 may not extend all the way to the bottom of the substrate 110 at this time or may extend to an etch stop layer on which the substrate 110 is disposed.

In any case, in this embodiment of the method according to the inventive concept, the TSV hole 170 is formed by etching the interlayer insulating layer 160 and the substrate 110 using plasma, i.e., by a plasma etching process. Accordingly, charges are produced when the TSV hole 170 is formed.

However, the gate dielectric layer 141 of the gate 140 of the transistor is not charged at time; rather the charging protection gate dielectric layer 151 of the charging protection gate 150 traps the charges produced as a result of the plasma etching process.

More specifically, high density plasma having negative or positive charges is generated to form the TSV hole 170 through the substrate 110. In the case in which the semiconductor integrated circuit device being fabricated is small and highly integrated, the distance between the TSV hole 170 being formed and the gate 140 is relatively short. Therefore, positive charges (+ ions) constituting the plasma, for example, would tend to migrate to the gate dielectric layer 141 of the gate 140 because of the potential of the polarized well 121. If the gate dielectric layer 141 were to be charged by the plasma, the gate dielectric layer 141 could be damaged and the operability of the gate 140 would be degraded.

However, according to an aspect of the inventive concept, the charging protection well 123 and the charging protection gate 150 are formed before the TSV 170 is formed by a plasma etching process. Therefore, the positive charges (+ ions) of the plasma migrate through the charging protection well 123 to the charging protection gate dielectric layer 151 of the charging protection gate 150 that is close to the TSV hole 170, but not to the gate dielectric layer 141 of the active transistor of the device. Accordingly the gate 140 of the device can be prevented from being damaged and thus, the device will possess a highly reliable gate 140 is formed.

Figure 23:
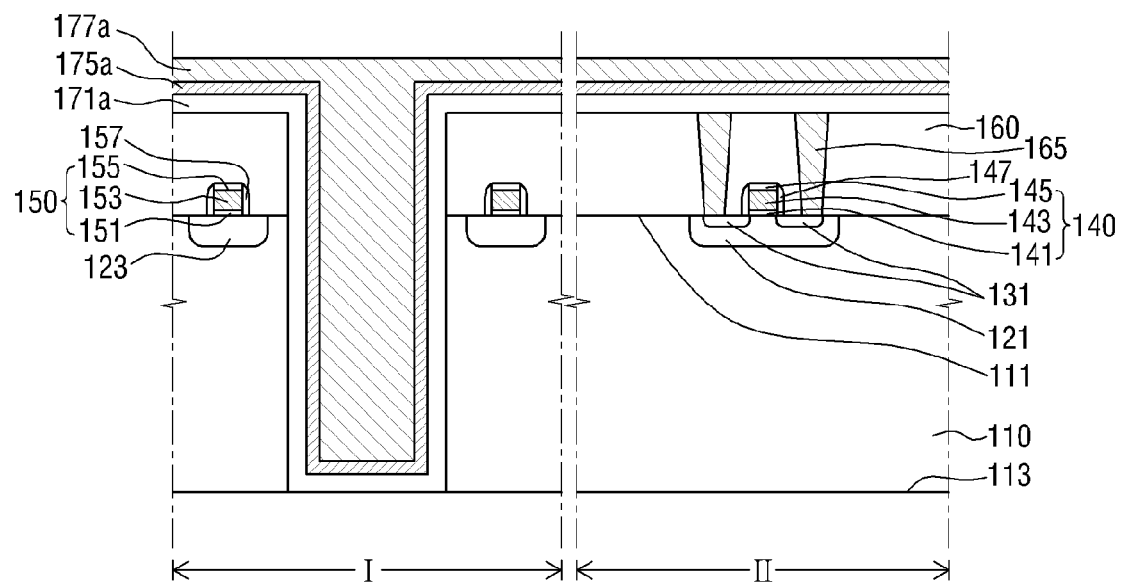

Referring to FIG. 23, a separation layer 171a, a seed layer 175a, and a conductive layer 177a are sequentially formed in the TSV hole 170. The separation layer 171a may be conformally formed along the sides and bottom of the TSV hole 170, the seed layer 175a may be conformally formed on the separation layer 171a, and the conductive layer 177a may be formed to fill the remaining portion of the hole 170.

Figure 24:
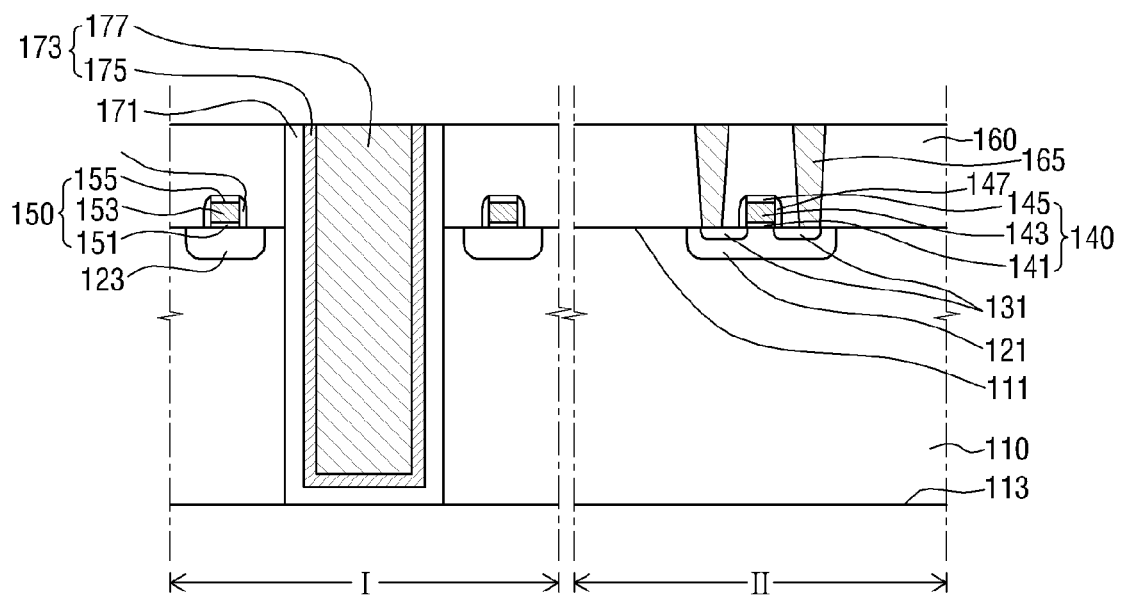

Referring to FIG. 24, a planarization process is performed until an upper surface of the interlayer insulating layer 160 is exposed. The planarization process may be performed, for example, through a CMP process or a cutting process. Through the planarization process, a separation layer 171 and a TSV contact 173 may be formed in the TSV hole 170.

Figure 25:
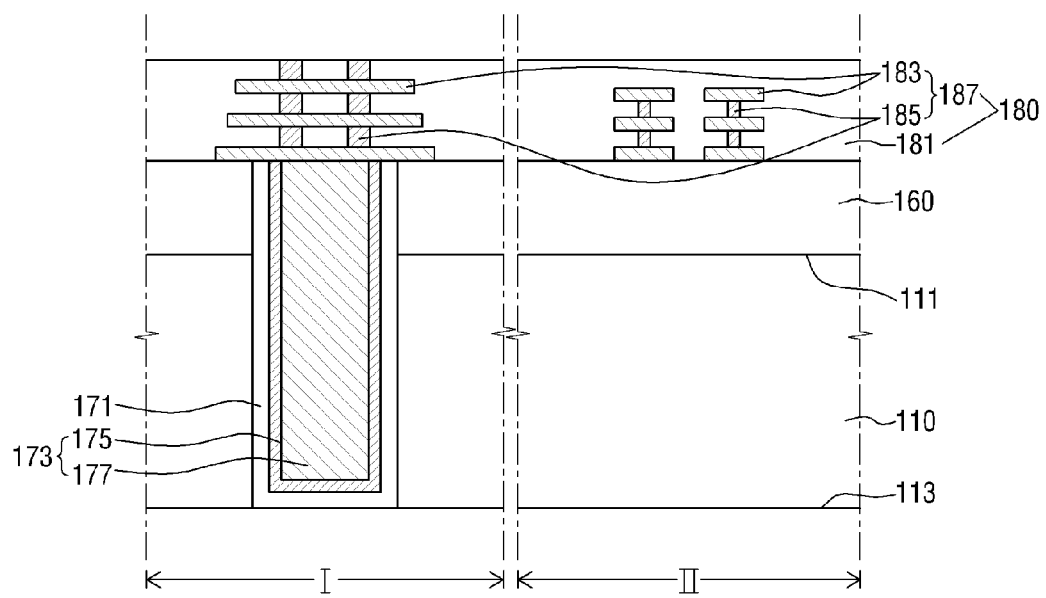

Referring to FIG. 25, a BEOL structure 180 is formed on the interlayer insulating layer 160. The BEOL structure 180 includes an interlayer insulating layer 181 and a plurality of multilayer wiring patterns 187 that are insulated by the interlayer insulating layer 181. The plurality of multilayer wiring patterns 187 may include a plurality of metal wiring layers 183 and a plurality of contact plugs 185. The plurality of metal wiring layers 183 may be formed in the interlayer insulating layer 181, and the plurality of contact plugs 185 may electrically connect the plurality of metal wiring layers 183 to each other. However, the plurality of multilayer wiring patterns 187 of the BEOL structure 180 are not electrically connected to the charging protection well 123 and the charging protection gate 150, but are electrically connected to the source/drain region 131 and/or the gate 140.

Then, a planarization process is performed at the backside of the substrate 110, e.g., on the back surface of the substrate 110. As a result, a TSV contact 173 extending through the substrate 110 is formed, i.e., the TSV contact 173 is exposed at the second surface 113.

Then, first connection pad 191 is formed on the second surface 113, and second connection pad 193 is formed on the first surface 111 to complete the semiconductor integrated circuit device as shown in FIG. 2. The first and second connection pads 191 and 193 may be electrically connected to the TSV contact 173 and/or to the electronic device disposed in the second region II, e.g., to the source/drain region 131 and the gate 140.

Another embodiment of a method of fabricating a semiconductor integrated circuit device according to the inventive concept will now be described with reference to FIGS. 17 to 21 and 26 to 28. Aspects of the method similar to those of the previous embodiment may not be described again in detail, for the sake of brevity.

In particular, first, steps similar to those shown in and described with reference to FIGS. 17 to 21 are carried out.

Figure 26:
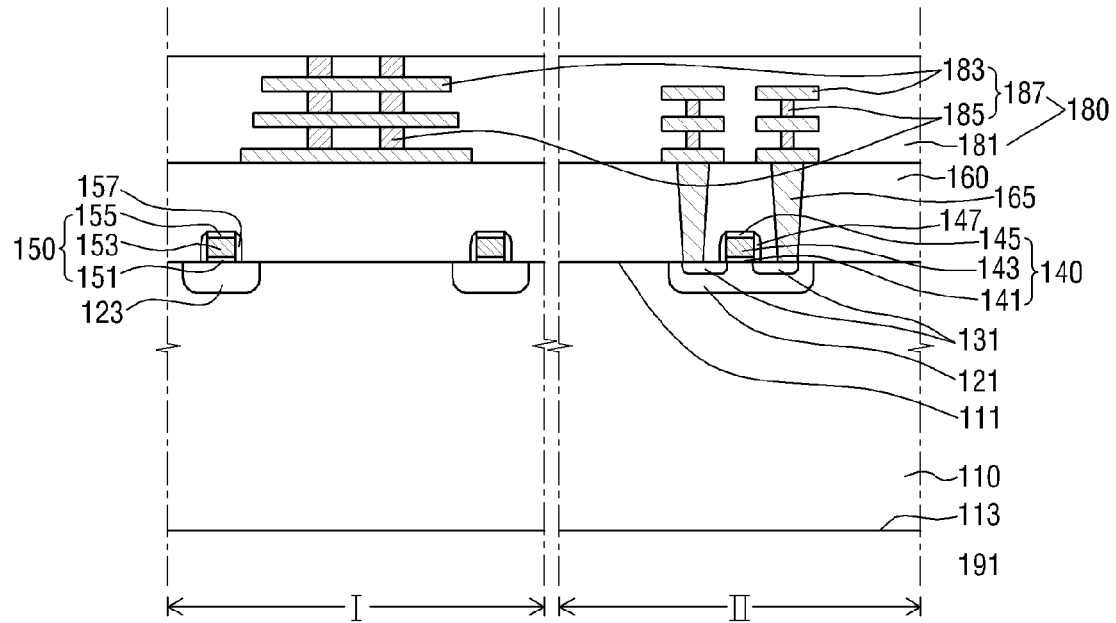
FIGS. 26 to 28 illustrate another embodiment of a method of fabricating a semiconductor integrated circuit device according to the inventive concept, wherein each of FIGS. 26, 26 and 28 is a cross-sectional view of the device during the course of its manufacture.

Next, referring to FIG. 26, a BEOL structure 180 is formed on an interlayer insulating layer 160.

Figure 27:
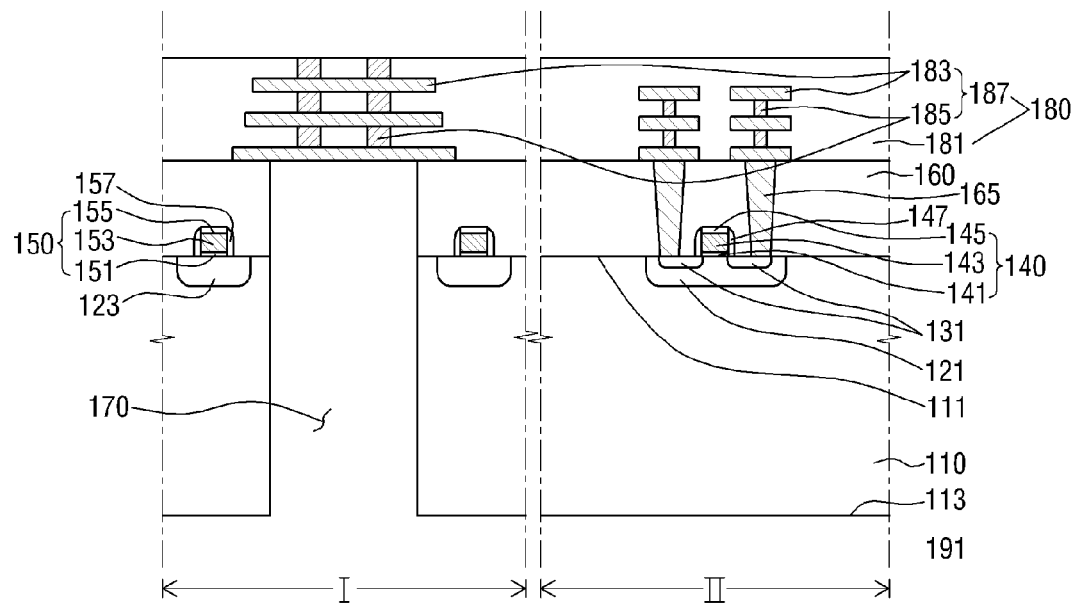

Referring to FIG. 27, a TSV hole 170 is formed beginning at a second surface 113 of a substrate 110. The TSV hole 170 may be formed through the substrate 110 and the interlayer insulating layer 160. Furthermore, the TSV hole 170 is formed inside charging protection well 123 so that the charging protection well 123 and a charging protection gate 150 are interposed between the well 121 and the gate 140.

Figure 28:
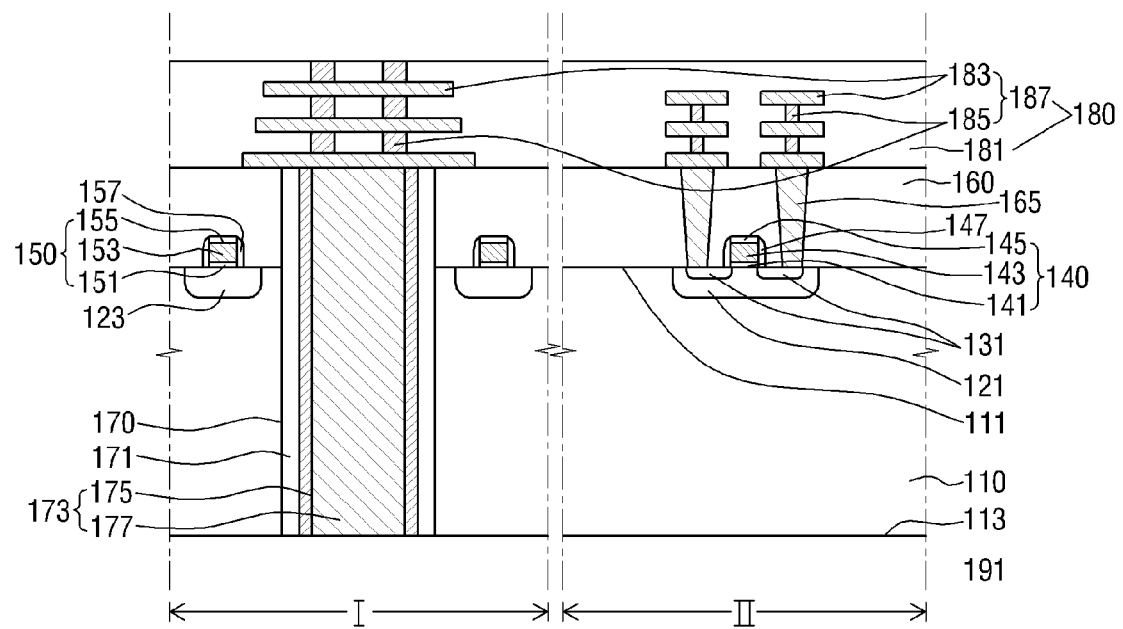

Referring to FIG. 28, a separation layer 171 is formed along the side of the TSV hole 170, a seed layer 175 is formed on a side wall surface of the separation layer 171, and a conductive layer 177 is formed to fill the remaining portion of the TSV hole 170. The seed layer 175 and the conductive layer 177 constitute a TSV contact 173 that extends through the interlayer insulating layer 160 and the substrate 110.

Then, a first connection pad 191 is formed on the second surface 113, and a second connection pad 193 is formed on the BEOL structure 180 to complete the semiconductor integrated circuit device as illustrated in FIG. 2.

Still another embodiment of a method of fabricating a semiconductor integrated circuit device according to the inventive concept will be described with reference to FIGS. 29 to 34. Aspects of the method similar to those of the previous embodiments may not be described again in detail, for the sake of brevity.

Figure 29:
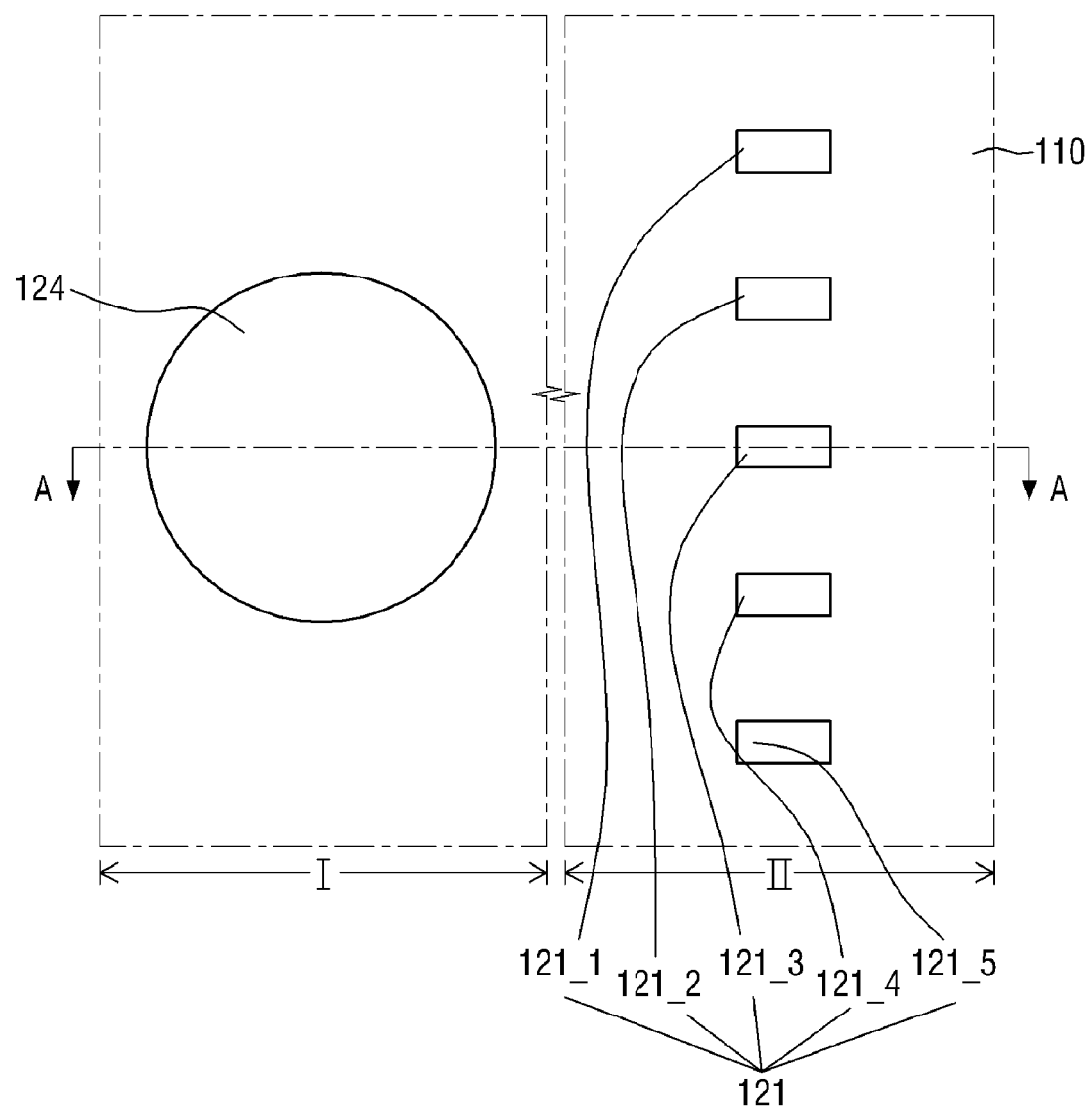
Figure 30:
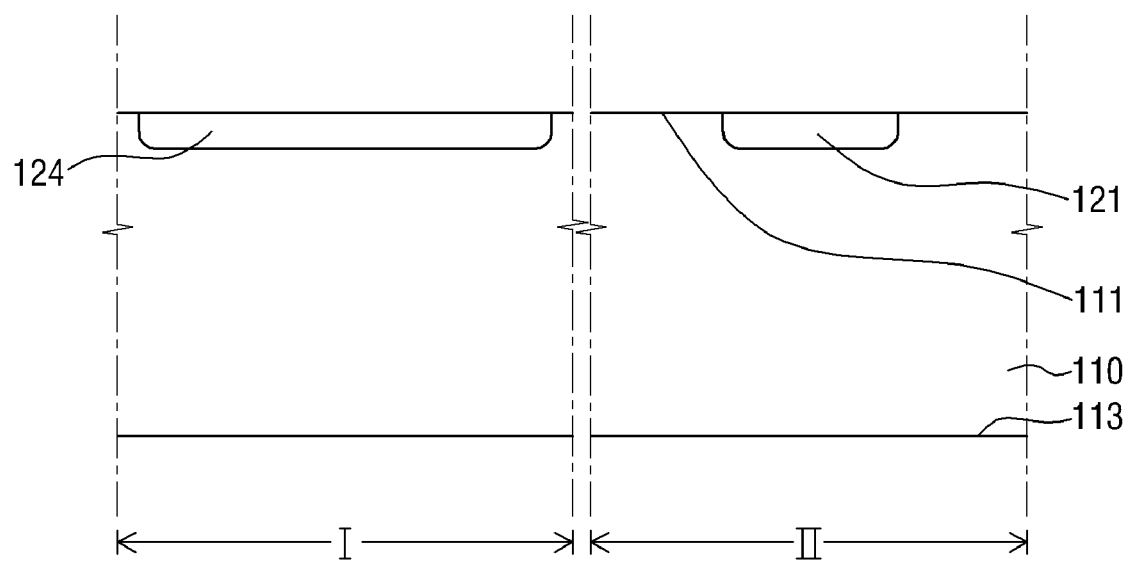

Referring to FIGS. 29 and 30, a charging protection well 124 is formed in a first region I of a substrate 110, and a well 121 is formed in a second region II.

Figure 31:
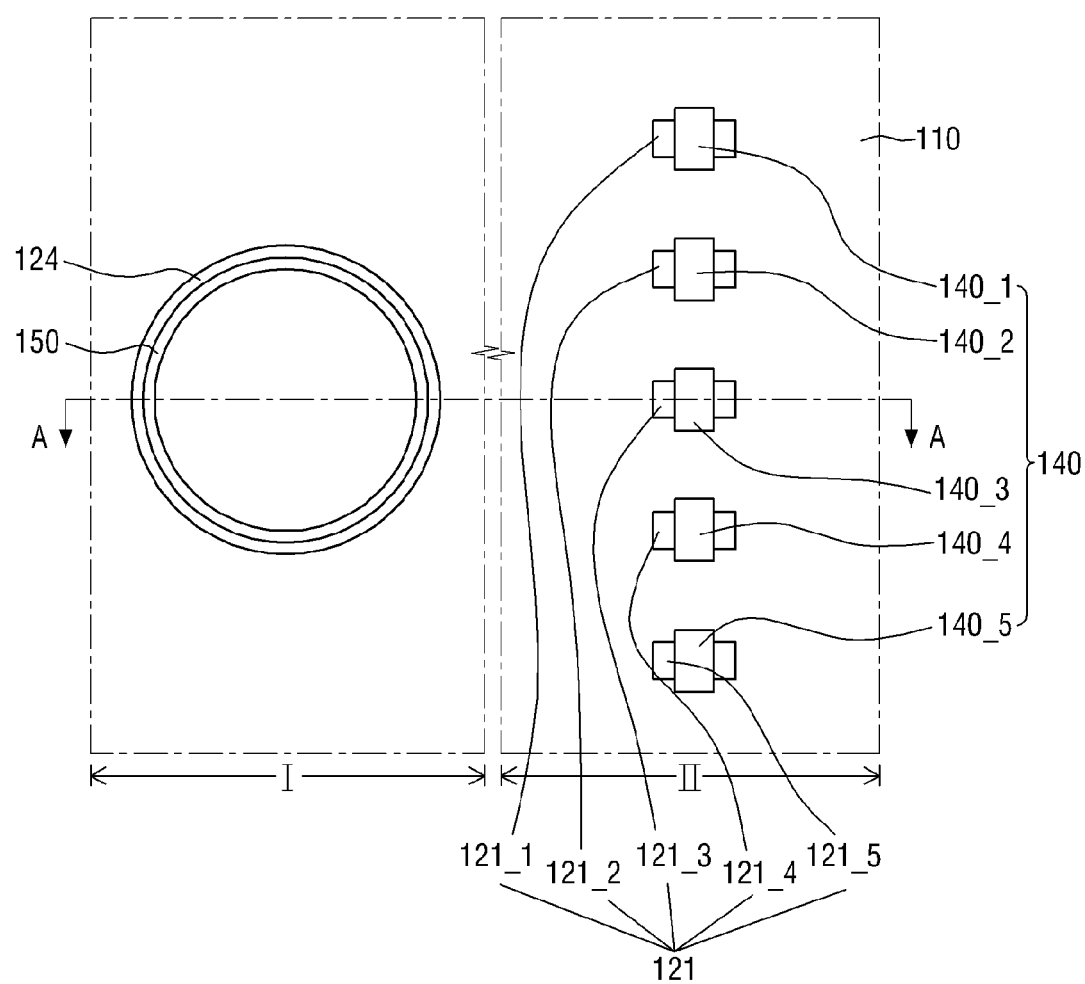
Figure 32:
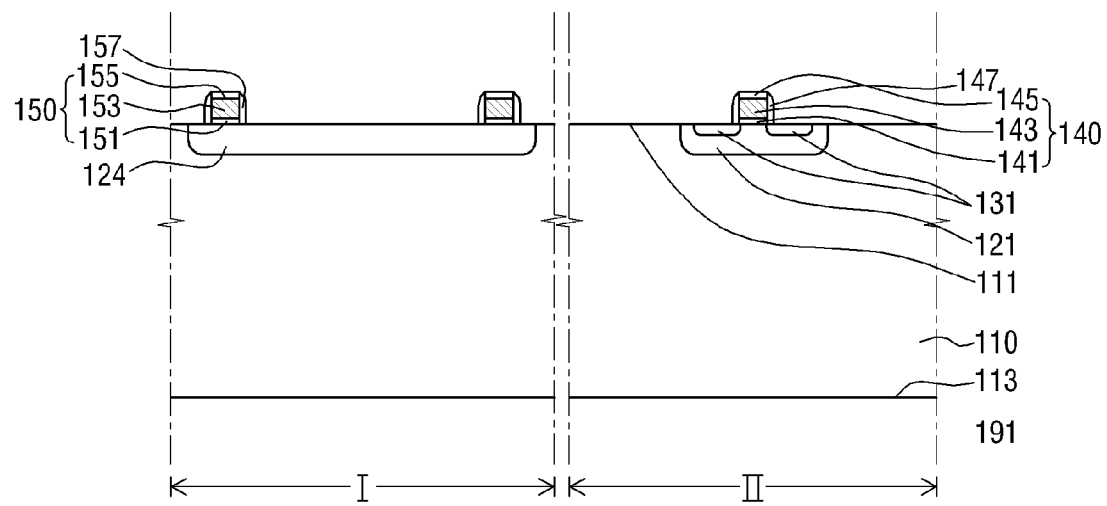

Referring to FIGS. 31 and 32, a charging protection gate 150 is formed on the charging protection well 124, and a gate 140 is formed on the well 121. The charging protection gate 150 may be formed in the shape of an annulus, i.e., a circular band.

Figure 33:
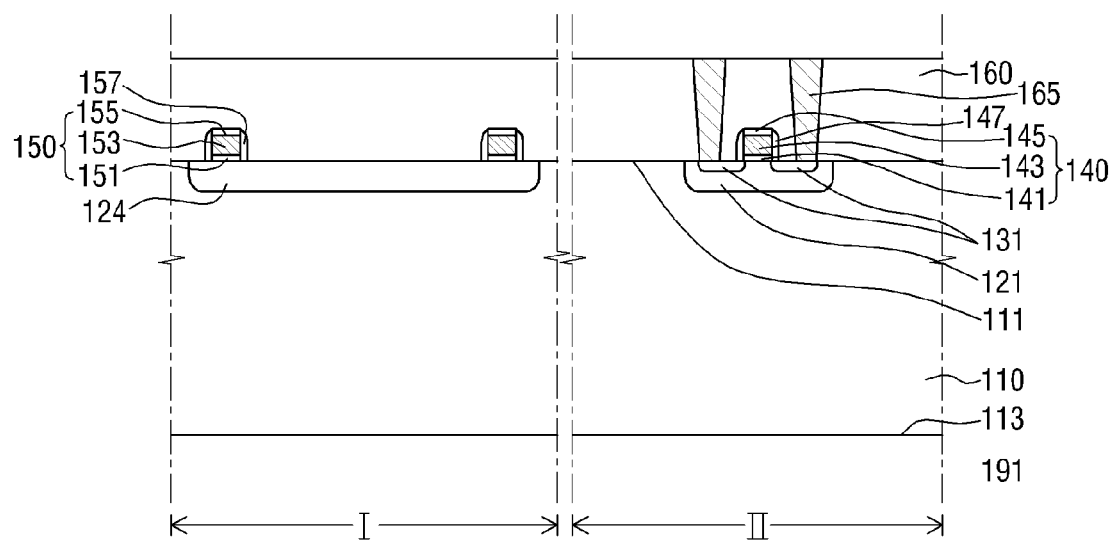
Figure 34:
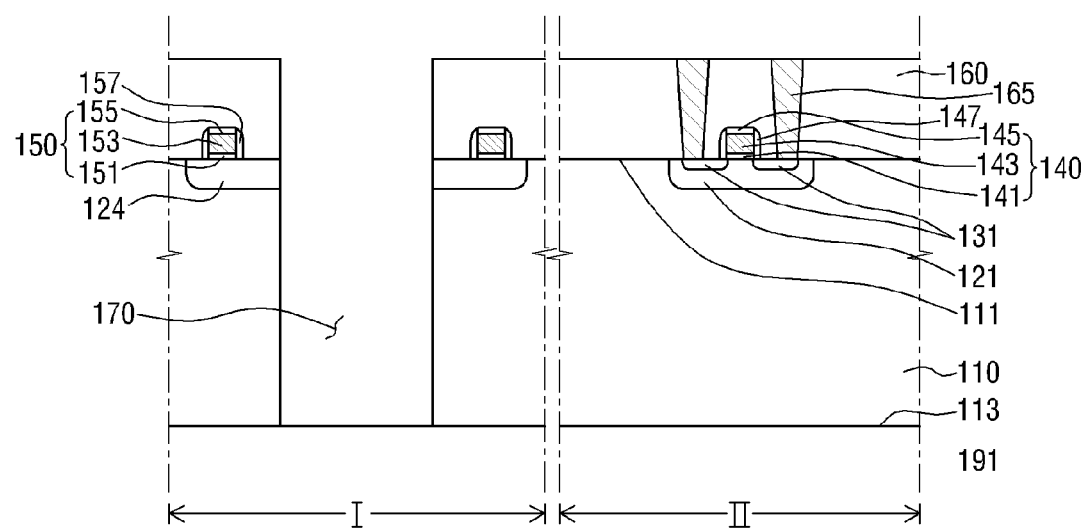

Referring to FIG. 33, an interlayer insulating layer 160 is formed to cover the charging protection gate 150 and the gate 140 on the substrate 110. Then, a contact 165 is formed in and through the interlayer insulating layer 160. Referring to FIG. 34, a TSV hole 170 is then formed in the interlayer insulating layer 160 and the substrate 110. The TSV hole 170 is formed through the interlayer insulating layer 160 in the charging protection well 124. Accordingly, the resulting charging protection well 124 has a side wall surface that is exposed by, and thus delimits part of the side of, the TSV hole 170.

Then, a separation layer 171 and a TSV contact 173 are formed in the TSV hole 170 (in a manner similar to the shown in and described with reference to FIGS. 23 and 24), and a BEOL structure 180 is formed on the interlayer insulating layer 160. Note, the second surface 113 of the substrate 110 may be planarized to form the TSV contact 173 through the substrate 110 after the BEOL structure is formed on the interlayer insulating layer 160. Also, first and second connection pads 191 and 193 may be formed to complete the semiconductor integrated circuit device as illustrated in FIG. 8.

As described above, a semiconductor integrated circuit device fabricated according to the inventive concept prevents a gate dielectric layer from being charged and a gate structure from being damaged when a TSV hole is formed and thus, the device has a high degree of reliability.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor integrated circuit device comprising:
  a substrate that has a first outer surface and a second outer surface, and a TSV (through silicon via) hole extending therethrough between the first outer surface and the second outer surface;
  a TSV contact in the TSV hole;
  a first well in the substrate and having a surface contiguous with the first outer surface of the substrate;
  a first gate of an active device on the first well;
  a charging protection well in the substrate, interposed between the TSV hole and the first well as spaced in the substrate from the first well, having a surface contiguous with the first outer surface of the substrate, and surrounding the TSV hole; and
  a charging protection gate on the charging protection well, and
  wherein the charging protection gate is a dummy gate electrically isolated from the active device.

2. The semiconductor integrated circuit device of claim 1, wherein the charging protection gate is spaced apart from the TSV hole.

3. The semiconductor integrated circuit device of claim 1, wherein the charging protection gate comprises:
  a charging protection gate dielectric layer on the charging protection well; and
  a charging protection gate electrode on the charging protection gate dielectric layer.

4. The semiconductor integrated circuit device of claim 3, wherein the first gate comprises:
  a gate dielectric layer on the first well; and
  a gate electrode on the gate dielectric layer.

5. The semiconductor integrated circuit device of claim 1, further comprising:
  an interlayer insulating layer covering the charging protection gate and the first gate on the substrate; and
  a plurality of wiring patterns disposed on the interlayer insulating layer,
  wherein the plurality of wiring patterns are electrically connected to the TSV electrode and the first well.

6. The semiconductor integrated circuit device of claim 5, wherein the TSV hole and the TSV electrode extend through the interlayer insulating layer.

7. The semiconductor integrated circuit device of claim 1, further comprising a field insulating layer surrounding the TSV hole and interposed between the TSV hole and the charging protection well.

8. The semiconductor integrated circuit device of claim 1, wherein a side wall surface of the charging protection well delimits part of the TSV hole.

9. The semiconductor integrated circuit device of claim 8, further comprising a field insulating layer surrounding the TSV hole and disposed in the charging protection well, and
  wherein a side wall of the field insulating layer delimits part of the TSV hole.

10. The semiconductor integrated circuit device of claim 1, wherein the charging protection gate has a plurality of discrete segments spaced apart from each other along the charging protection well.

11. The semiconductor integrated circuit device of claim 10, wherein each of the plurality of segments of the charging protection gate is disposed the same distance from the TSV hole as the others of the segments.

12. The semiconductor integrated circuit device of claim 1, wherein the charging protection gate surrounds the TSV hole.

13. A semiconductor integrated circuit device comprising:
a substrate that has a first surface and a second surface;
a TSV (through silicon via) extending through substrate between the first surface and the second surface;
a first well in the substrate at the first surface, the well having one of a P-type and N-type conductivity;
a transistor including a gate electrode, and a gate dielectric layer extending between the first well and the gate electrode;
a charging protection well in the substrate and interposed between the TSV and the first well as spaced in the substrate from the first well, the charging protection well having the same type of conductivity as the first well; and
a charging protection structure, wherein the charging protection structure comprises a protection dielectric layer on the charging protection well, and an electrically conductive layer disposed directly on the dielectric layer so as to have the form of a gate,
wherein the electrically conductive layer of the charging protection structure is a dummy layer electrically isolated from the transistor.

14. The semiconductor integrated circuit device of claim 13, wherein the charging protection well surrounds the TSV.

15. The semiconductor integrated circuit device of claim 13, further comprising an interlayer insulating layer disposed on the first surface of the substrate, and wherein the charging protection structure and the interlayer insulating layer together cover the charging protection well in its entirety.

16. The semiconductor integrated circuit device of claim 15, further comprising a contact extending through the interlayer insulating layer to the transistor, and wiring disposed on the interlayer insulating layer, wherein the wiring electrically connects the contact and the TSV and is electrically isolated from the charging protections structure.

17. A semiconductor package comprising:
a package substrate;
a first semiconductor integrated circuit device disposed on the package substrate; and
a second semiconductor integrated circuit device disposed on the first semiconductor integrated circuit device,
wherein the first semiconductor integrated circuit device includes:
a device substrate that has a first outer surface and a second outer surface, and a TSV (through silicon via) hole extending therethrough between the first outer surface and the second outer surface,
a TSV contact in the TSV hole,
a first well in the device substrate and having a surface contiguous with the first outer surface of the device substrate,
a first gate of an active device on the first well,
a charging protection well in the device substrate, interposed between the TSV hole and the first well as spaced in the device substrate from the first well, having a surface contiguous with the first outer surface of the device substrate, and surrounding the TSV hole, and
a charging protection gate on the charging protection well, and
wherein the charging protection gate is a dummy gate electrically isolated from the active device.

18. The semiconductor package of claim 17, wherein the first semiconductor integrated circuit device further comprises a field insulating layer surrounding the TSV hole and interposed between the TSV hole and at least part of the charging protection well.

* * * * *